(12) United States Patent
Kishimoto

(10) Patent No.: US 11,224,937 B2
(45) Date of Patent: Jan. 18, 2022

(54) LINE BEAM LIGHT SOURCE, LINE BEAM IRRADIATION DEVICE, AND LASER LIFT OFF METHOD

(71) Applicant: HON HAI PRECISION INDUSTRY CO., LTD, New Taipei (TW)

(72) Inventor: Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 657 days.

(21) Appl. No.: 16/065,858

(22) PCT Filed: Jul. 21, 2016

(86) PCT No.: PCT/JP2016/071345
§ 371 (c)(1),
(2) Date: Jun. 25, 2018

(87) PCT Pub. No.: WO2017/110121
PCT Pub. Date: Jun. 29, 2017

(65) Prior Publication Data
US 2020/0287356 A1     Sep. 10, 2020

(30) Foreign Application Priority Data
Dec. 25, 2015  (JP) ............................. JP2015-253586

(51) Int. Cl.
*B23K 26/00*      (2014.01)
*B23K 26/57*      (2014.01)
(Continued)

(52) U.S. Cl.
CPC ........ *B23K 26/0006* (2013.01); *B23K 26/032* (2013.01); *B23K 26/0736* (2013.01);
(Continued)

(58) Field of Classification Search
CPC ......... H01S 5/4043–405; H01S 5/4012; B23K 26/0736; B23K 26/0738; B23K 26/0613–0619
See application file for complete search history.

(56) References Cited

U.S. PATENT DOCUMENTS

| | | | |
|---|---|---|---|
| 6,780,692 B2 * | 8/2004 | Tatsuki | H01L 29/66765 257/E21.414 |
| 6,897,889 B2 * | 5/2005 | Tanaka | B23K 26/0604 347/244 |

(Continued)

FOREIGN PATENT DOCUMENTS

| | | |
|---|---|---|
| CN | 102049611 A | 5/2011 |
| CN | 103650265 A | 3/2014 |

(Continued)

*Primary Examiner* — Joshua King
(74) *Attorney, Agent, or Firm* — ScienBiziP, P.C.

(57) ABSTRACT

A line beam irradiation apparatus (1000) includes a work stage (200), a line beam source (100) for irradiating a work (300) placed on the work stage (200) with a line beam; and a transporting device (250) for moving at least one of the work stage (200) and the line beam source (100) such that an irradiation position of the line beam on the work moves in a direction transverse to the line beam. The line beam source includes a plurality of semiconductor laser devices and a support for supporting the plurality of semiconductor laser devices. The plurality of semiconductor laser devices are arranged along a same line extending in a fast axis direction, and the laser light emitted from emission regions of respective ones of the semiconductor laser devices diverge parallel to the same line to form the line beam.

2 Claims, 28 Drawing Sheets

(51) Int. Cl.
*B23K 26/03* (2006.01)
*B23K 26/073* (2006.01)
*H01S 5/062* (2006.01)
*H01S 5/40* (2006.01)
*H01S 5/0225* (2021.01)
*H01S 5/00* (2006.01)

(52) U.S. Cl.
CPC ............ *B23K 26/57* (2015.10); *H01S 5/0225* (2021.01); *H01S 5/062* (2013.01); *H01S 5/06233* (2013.01); *H01S 5/405* (2013.01); *H01S 5/4075* (2013.01); *H01S 5/005* (2013.01)

(56) References Cited

U.S. PATENT DOCUMENTS

| | | | | |
|---|---|---|---|---|
| 7,639,722 | B1* | 12/2009 | Paxton | G02B 27/0972 359/831 |
| 7,873,091 | B2* | 1/2011 | Parent | G02B 27/0966 372/50.12 |
| 2003/0058898 | A1* | 3/2003 | Beier | B41J 2/45 372/3 |
| 2003/0089691 | A1* | 5/2003 | Tanaka | H01L 21/02686 219/121.67 |
| 2003/0196996 | A1* | 10/2003 | Jennings | B23K 26/0665 219/121.73 |
| 2003/0211714 | A1* | 11/2003 | Yamazaki | B23K 26/0604 438/487 |
| 2003/0228723 | A1* | 12/2003 | Yamazaki | H01L 21/2026 438/164 |
| 2004/0040938 | A1* | 3/2004 | Yamazaki | B23K 26/0604 219/121.6 |
| 2004/0253838 | A1* | 12/2004 | Yamazaki | B23K 26/0604 438/795 |
| 2004/0263986 | A1* | 12/2004 | Brown | G02B 27/09 359/626 |
| 2005/0063435 | A1* | 3/2005 | Imai | G02B 27/0955 372/43.01 |
| 2006/0114955 | A1* | 6/2006 | Steckman | H01S 5/4025 372/50.12 |
| 2006/0126690 | A1* | 6/2006 | Kido | H01S 5/405 372/43.01 |
| 2006/0262408 | A1* | 11/2006 | Kato | G02B 27/0994 359/618 |
| 2006/0280209 | A1* | 12/2006 | Treusch | H01S 5/4062 372/32 |
| 2007/0295974 | A1* | 12/2007 | Fontanella | H01S 3/2383 257/88 |
| 2008/0205459 | A1* | 8/2008 | Ekubo | H04N 9/3129 372/26 |
| 2008/0210671 | A1* | 9/2008 | Jennings | B23K 26/0613 219/121.61 |
| 2009/0173724 | A1* | 7/2009 | Ogino | B23K 26/03 219/121.75 |
| 2009/0294420 | A1* | 12/2009 | Abramov | C03B 33/04 219/121.69 |
| 2010/0103973 | A1* | 4/2010 | Bonna | G02B 27/0977 372/50.12 |
| 2010/0272144 | A1* | 10/2010 | Chen | B23K 26/0608 372/50.12 |
| 2011/0017280 | A1* | 1/2011 | Rumsby | B23K 26/0626 136/251 |
| 2012/0057345 | A1* | 3/2012 | Kuchibhotla | G02B 19/0057 362/237 |
| 2012/0257387 | A1* | 10/2012 | Kuchibhotla | H01S 5/405 362/237 |
| 2013/0182435 | A1* | 7/2013 | Mikhailov | G02B 27/095 362/247 |
| 2014/0038392 | A1* | 2/2014 | Yonehara | B81C 1/0038 438/463 |
| 2014/0064305 | A1* | 3/2014 | Sipes, Jr. | H01S 5/4012 372/6 |
| 2014/0238592 | A1* | 8/2014 | Marinov | H01L 21/67132 156/272.8 |
| 2015/0155685 | A1 | 6/2015 | Groenenborn et al. | |
| 2015/0179449 | A1* | 6/2015 | Anikitchev | B23K 26/0608 438/7 |
| 2016/0036194 | A1* | 2/2016 | Sato | H01S 3/094053 359/345 |
| 2016/0241001 | A1* | 8/2016 | Dubost | C21D 1/38 |
| 2016/0372893 | A1* | 12/2016 | McLaurin | H01S 5/32341 |
| 2017/0182590 | A1* | 6/2017 | Goya | B23K 26/082 |

FOREIGN PATENT DOCUMENTS

| | | | |
|---|---|---|---|
| CN | 104396101 A | | 3/2015 |
| JP | 2000091231 A | * | 3/2000 |
| JP | 2015-24426 A | | 2/2015 |
| JP | 2015-524609 A | | 8/2015 |
| WO | WO-2019096910 A1 | * | 5/2019 ............ H01S 5/4012 |

* cited by examiner

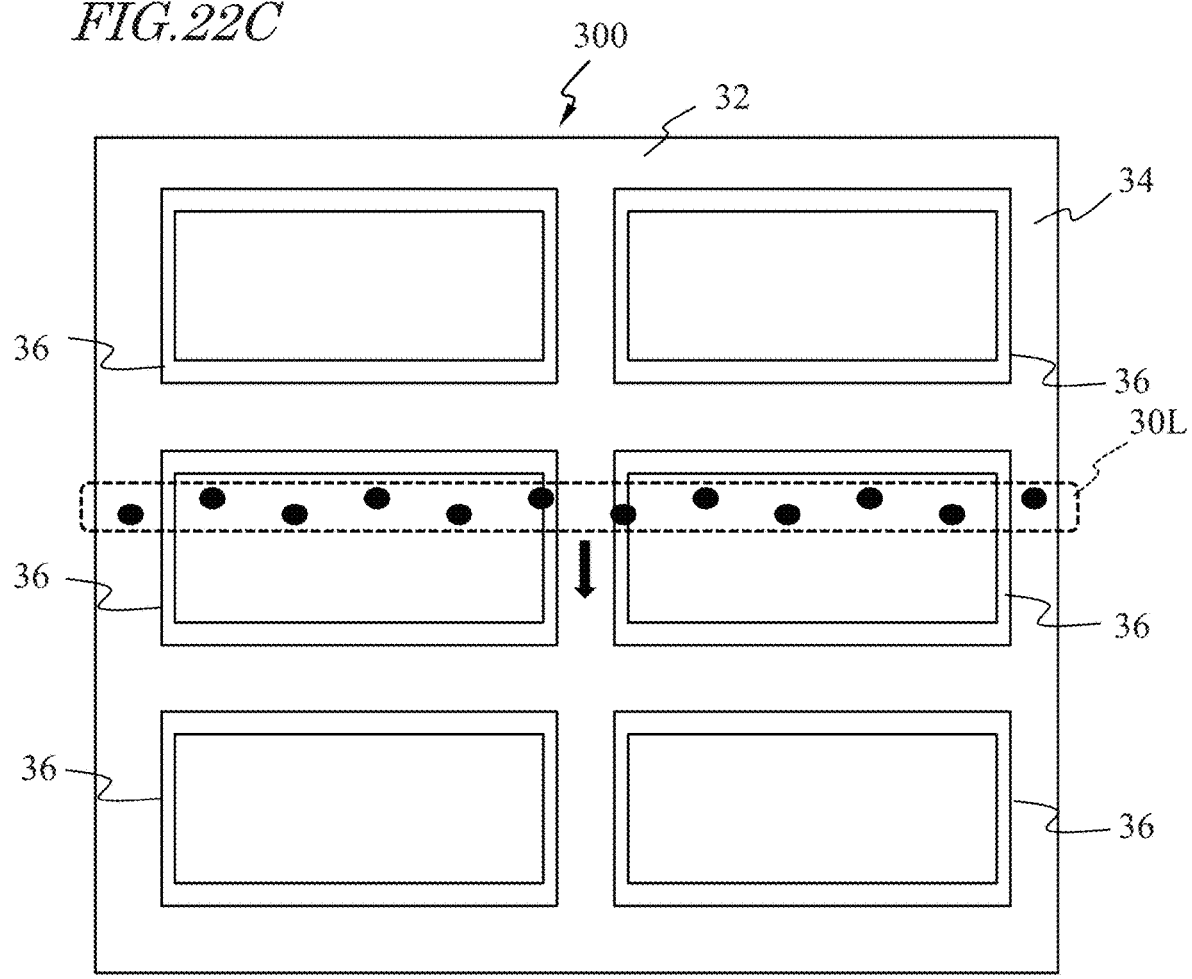

LINE BEAM LIGHT SOURCE, LINE BEAM IRRADIATION DEVICE, AND LASER LIFT OFF METHOD

TECHNICAL FIELD

The present application relates to a line beam source and a line beam irradiation apparatus. The present application also relates to a laser lift-off method and an electronic device production method which are carried out using the line beam irradiation apparatus.

BACKGROUND ART

In the technical field of production of electronic devices such as high-luminance LED (Light Emitting Diode) and flexible display, development of the laser lift-off method has been intensively advanced. In the case where a high-luminance LED is produced using a laser lift-off method, firstly, an LED including a multilayer stack of a nitride semiconductor is formed on a crystal-growth substrate, such as sapphire substrate. Thereafter, the LED is separated from the crystal-growth substrate by the laser lift-off method. In the case where a flexible display is produced, a polymer layer is formed on a glass substrate which serves as a carrier, and thereafter, a device is formed on the polymer layer, which includes a thin film transistor layer and an organic light emitting diode (OLED) layer. After completion of the formation process, the device is delaminated together with the polymer layer from the glass substrate by the laser lift-off method.

According to the laser lift-off method, it is necessary to irradiate the carrier (work) to which the device is bound with a laser beam of high light intensity such that a delamination phenomenon is caused by a thermal or photochemical reaction. Nowadays, as the source of the laser beam, a high power excimer laser equipment is usually used. A pulsed laser light emitted from the excimer laser equipment is shaped into a light beam whose cross-sectional shape is like an elongated line. Such a linear light beam is referred to as "line beam". The cross-sectional shape of the line beam on the work, i.e., the shape of a region irradiated with the light, is a rectangle of, for example, 720 mm in the long axis direction and 1 mm in the short axis direction.

An excimer laser annealing (ELA) unit which includes a complicated optical system for formation of a line beam has been put into practice as a unit for melting and recrystallizing a non-crystalline silicon film in a flat panel display production process. The ELA unit used for melting and recrystallizing a non-crystalline silicon film has been diverted to the laser lift-off method. The ELA unit is bulky, complicated in operation, and highly expensive in price and running cost.

Semiconductor laser devices, which are less expensive and easier in operation than the ELA unit, have had increasing laser power. Thus, replacing part of the ELA unit with high-power semiconductor laser devices has been studied. For example, a module of a laser diode array has been developed in which laser bars each including a plurality of emission regions (emitters) aligned in the horizontal direction are vertically stacked up. Such a laser diode array includes a large number of emitters two-dimensionally arrayed at high density and can therefore achieve a high optical output exceeding 1 kilowatt (kW) in total.

Patent Documents Nos. 1 and 2 disclose a two-dimensional planar array (laser diode array) of a plurality of semiconductor laser devices.

Patent Document No. 3 discloses a laser processing apparatus including a plurality of blue semiconductor laser devices each of which has an average power of not less than 1 watt. In this laser processing apparatus, laser light emitted from respective ones of the blue semiconductor laser devices are combined using optical fibers, whereby high-power laser light is generated.

CITATION LIST

Patent Literature

Patent Document No. 1: Japanese Laid-Open Patent Publication No. 2009-170881
Patent Document No. 2: U.S. Pat. No. 6,240,116
Patent Document No. 3: Japanese Laid-Open Patent Publication No. 2013-233556

SUMMARY OF INVENTION

Technical Problem

In the laser diode arrays disclosed in Patent Documents Nos. 1 and 2, laser light emitted from each emitter is collimated by a collimation lens into a parallel light beam. A bunch of the light beams is shaped by an optical system which includes reflection mirrors and other lenses so as to have a desired cross-sectional shape. When such an existing high-power laser diode array is used in laser lift-off, it is necessary to shape light beams emitted from a planar array light source into a desired line beam.

In the laser processing apparatus disclosed in Patent Document No. 3, each of a plurality of semiconductor laser devices is connected with an optical fiber, and therefore, high-precision alignment is required. In introduction of laser light into an optical fiber and during the process of transmitting laser light through the optical fiber, optical losses occur. Further, since the cross section of the laser light coming out of the optical fiber is circular, an optical system for shaping the laser light into a line beam is indispensable, and a further loss occurs in the beam shaping.

In a laser lift-off method for production of a small-sized flexible display, using a YAG laser (yttrium aluminum garnet solid-state laser) device, which is relatively inexpensive as compared with the ELA unit, has been studied. However, the YAG laser device also has the same problems as those of the ELA unit.

According to an embodiment of the present disclosure, a novel line beam source and a novel line beam irradiation apparatus which can be suitably used in the laser lift-off method are provided.

Solution to Problem

An exemplary embodiment of the line beam irradiation apparatus of the present invention includes: a work stage; a line beam source for irradiating a work placed on the work stage with a line beam; and a transporting device for moving at least one of the work stage and the line beam source such that an irradiation position of the line beam on the work moves in a direction transverse to the line beam. The line beam source includes a plurality of semiconductor laser devices and a support for supporting the plurality of semiconductor laser devices. Each of the plurality of semiconductor laser devices includes a semiconductor multilayer stack which has a facet, the facet including an emission region from which laser light is to be emitted. The emission region has a size in a fast axis direction that is parallel to a layer stacking direction of the semiconductor multilayer stack and a size in a slow axis direction that is perpendicular to the layer stacking direction. The plurality of semiconductor laser devices are arranged along a same line extending in the fast axis direction, and the laser light emitted from the emission regions of respective ones of the plurality of semiconductor laser devices diverge parallel to the same line to form the line beam.

An embodiment of the line beam source of the present invention includes: a plurality of semiconductor laser devices; and a support for supporting the plurality of semiconductor laser devices. Each of the plurality of semiconductor laser devices includes a semiconductor multilayer stack which has a facet, the facet including an emission region from which laser light is to be emitted. The emission region has a size in a fast axis direction that is parallel to a layer stacking direction of the semiconductor multilayer stack and a size in a slow axis direction that is perpendicular to the layer stacking direction. The plurality of semiconductor laser devices are arranged along a same line extending in the fast axis direction, and the laser light emitted from the emission regions of respective ones of the plurality of semiconductor laser devices diverge parallel to the same line to form a line beam.

A laser lift-off method of the present invention is a laser lift-off method with the use of the line beam irradiation apparatus as set forth in any of the foregoing paragraphs, the method including: providing a work which includes a carrier and a device bound to the carrier and placing the work on the work stage; irradiating the work placed on the work stage from the carrier side with the line beam from the line beam source; and moving at least one of the work stage and the line beam source such that an irradiation position of the line beam on the work moves in a direction transverse to the line beam.

An electronic device production method of the present invention is an electronic device production method with the use of the line beam irradiation apparatus as set forth in any of the foregoing paragraphs, the method including: providing a work which includes a carrier and an electronic device bound to the carrier and placing the work on the work stage; irradiating the work placed on the work stage from the carrier side with the line beam from the line beam source; moving at least one of the work stage and the line beam source such that an irradiation position of the line beam on the work moves in a direction transverse to the line beam; and obtaining the electronic device delaminated from the carrier of the work.

Advantageous Effects of Invention

According to an embodiment of the present invention, a line beam source which can replace the ELA unit is provided in order to form a line beam by taking advantage of such a characteristic that laser light emitted from a semiconductor laser device diverges anisotropically due to a diffraction effect.

BRIEF DESCRIPTION OF DRAWINGS

FIG. 22C is a plan view schematically showing the positions of the emission regions 24 of the semiconductor laser devices 40 in the staggered arrangement, which are projected onto the work 300.

DESCRIPTION OF EMBODIMENTS

The present inventor recognized that the light intensity distribution of a line beam which is necessary for laser lift-off does not need to have high uniformity unlike the line beam of the ELA unit used for melting and recrystallization of a non-crystalline silicon film, and then conceived the present invention. A line beam source and a line beam irradiation apparatus of the present disclosure form a line beam by taking advantage of such a characteristic that laser light emitted from a semiconductor laser device diverges anisotropically due to a diffraction effect. Firstly, this diffraction effect is described.

<Diffraction Effect of Semiconductor Laser Device>

Figure 1:
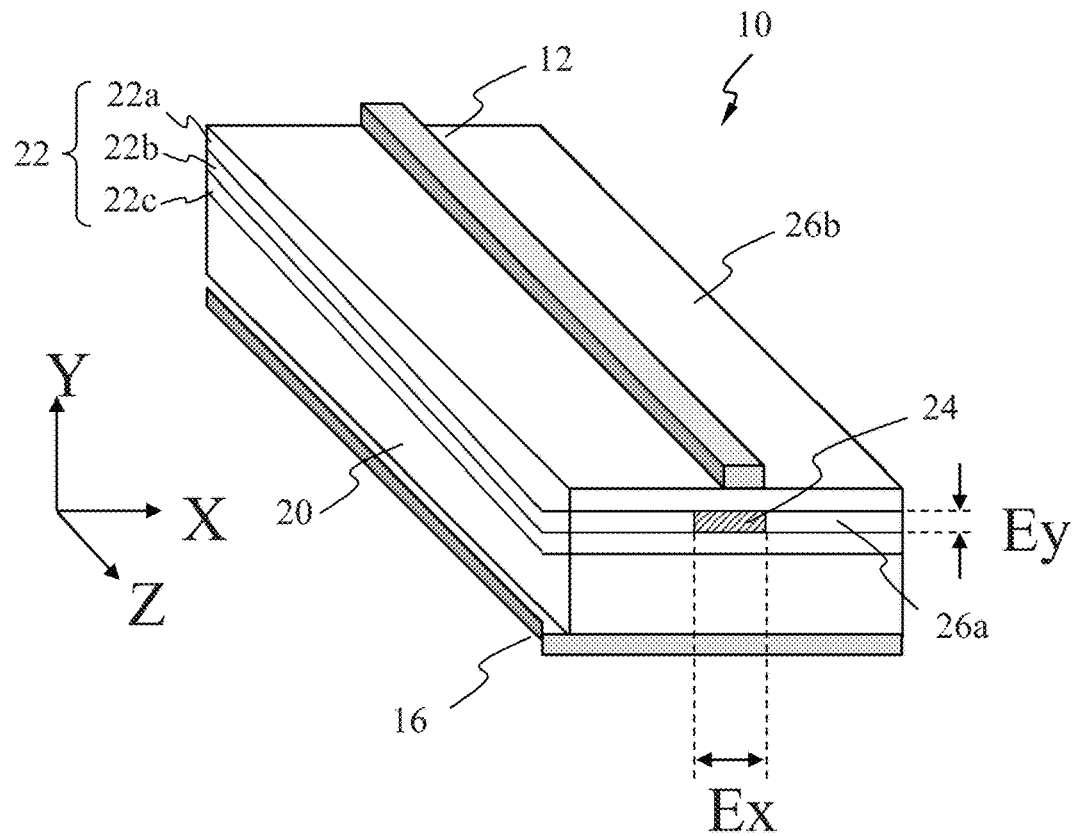
FIG. 1 is a perspective view schematically showing a basic configuration of a typical semiconductor laser device.

FIG. 1 is a perspective view schematically showing a basic configuration of a typical semiconductor laser device. In the drawing, the coordinate axes including the X-axis, the Y-axis and the Z-axis which are perpendicular to one another are shown. Also in the other attached drawings, the coordinate axes are shown. The X-axis, the Y-axis and the Z-axis represent common directions among all the drawings.

The semiconductor laser device 10 shown in FIG. 1 includes a semiconductor multilayer stack 22 which has an end face (a facet) 26a. The facet 26a includes an emission region (emitter) 24 from which laser light is to be emitted. In this example, the semiconductor multilayer stack 22 is supported on a semiconductor substrate 20 and includes a p-side cladding layer 22a, an active layer 22b, and an n-side cladding layer 22c. On the upper surface 26b of the semiconductor multilayer stack 22, a p-side electrode 12 in the shape of a stripe is provided. On the rear surface of the semiconductor substrate 20, an n-side electrode 16 is provided. When an electric current which is greater than a threshold flows through a predetermined region of the active layer 22b from the p-side electrode 12 to the n-side electrode 16, laser oscillation occurs. The facet 26a of the semiconductor multilayer stack 22 is covered with an unshown reflective film. Laser light is emitted from the emission region 24 via the reflective film.

The configuration shown in FIG. 1 is merely an example of the configuration of the semiconductor laser device 10 and is simplified for the sake of simple description. This simplified configuration example does not limit embodiments of the present disclosure which will be described later. Note that, in the other drawings, constituents such as the n-side electrode 16 will be omitted for simplicity.

In the semiconductor laser device 10 shown in FIG. 1, the facet 26a of the semiconductor multilayer stack 22 is parallel to the XY plane, and therefore, laser light is emitted in the Z-axis direction from the emission region 24. The optical axis of the laser light is parallel to the Z-axis direction. The emission region 24 in the facet 26a has a size Ey in a direction parallel to the stacking direction of the semiconductor multilayer stack 22 (Y-axis direction) and a size Ex in a direction perpendicular to the stacking direction (X-axis direction). In general, the relationship of Ey<Ex holds.

The size in the Y-axis direction of the emission region 24, Ey, is defined by the thickness of the active layer 22b. The thickness of the active layer 22b is usually equal to or smaller than about half the laser oscillation wavelength. Meanwhile, the size in the X-axis direction of the emission region 24, Ex, can be defined by a structure which confines in a horizontal transverse direction (X-axis direction) an electric current or light which contributes to laser oscillation. In the example of FIG. 1, the size Ex can be defined by the width of the p-side electrode 12 in the shape of a stripe. In general, the size in the Y-axis direction of the emission region 24, Ey, is equal to or smaller than about 0.1 μm, and the size in the X-axis direction, Ex, is greater than 1 μm. To increase the optical output, increasing the size in the X-axis direction of the emission region 24, Ex, is effective. The size in the X-axis direction, Ex, can be set to, for example, 50 μm or more.

In this specification, Ex/Ey is referred to as the "aspect ratio" of the emission region. The aspect ratio (Ex/Ey) in the high-power semiconductor laser device can be set to, for example, 50 or more or may be set to 100 or more. In this specification, a semiconductor laser device whose aspect ratio (Ex/Ey) is not less than 50 is referred to as "broad area type semiconductor laser device". In many cases, the broad area type semiconductor laser device oscillates such that the horizontal transverse mode is multiple modes rather than a single mode.

Figure 2A:
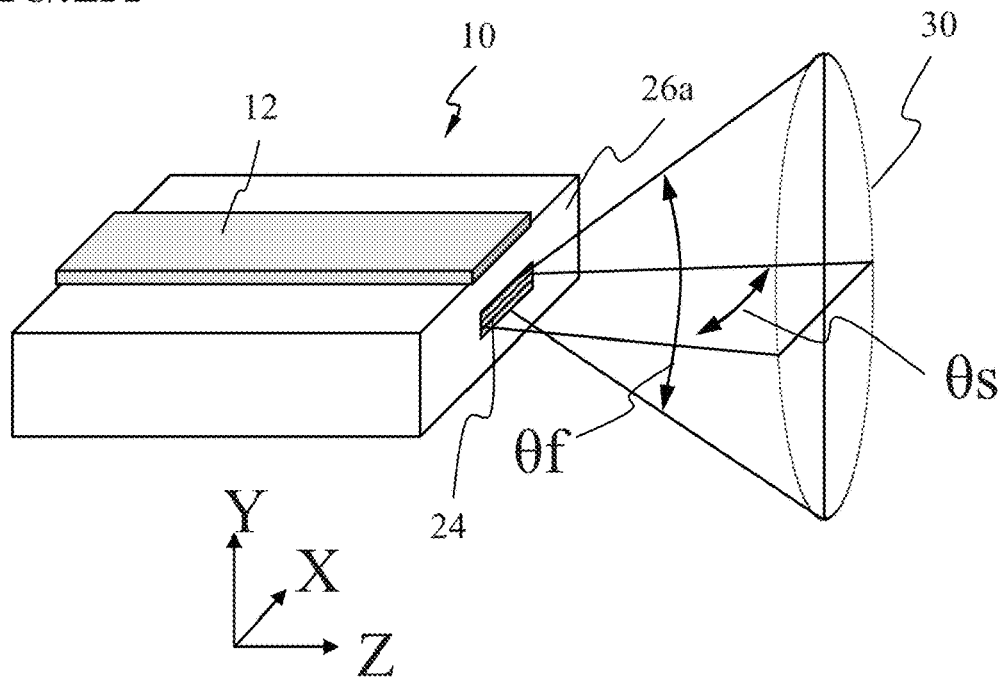
FIG. 2A is a perspective view schematically showing the spread (divergence) of laser light 30 coming out from an emission region 24 of a semiconductor laser device 10.
Figure 2B:
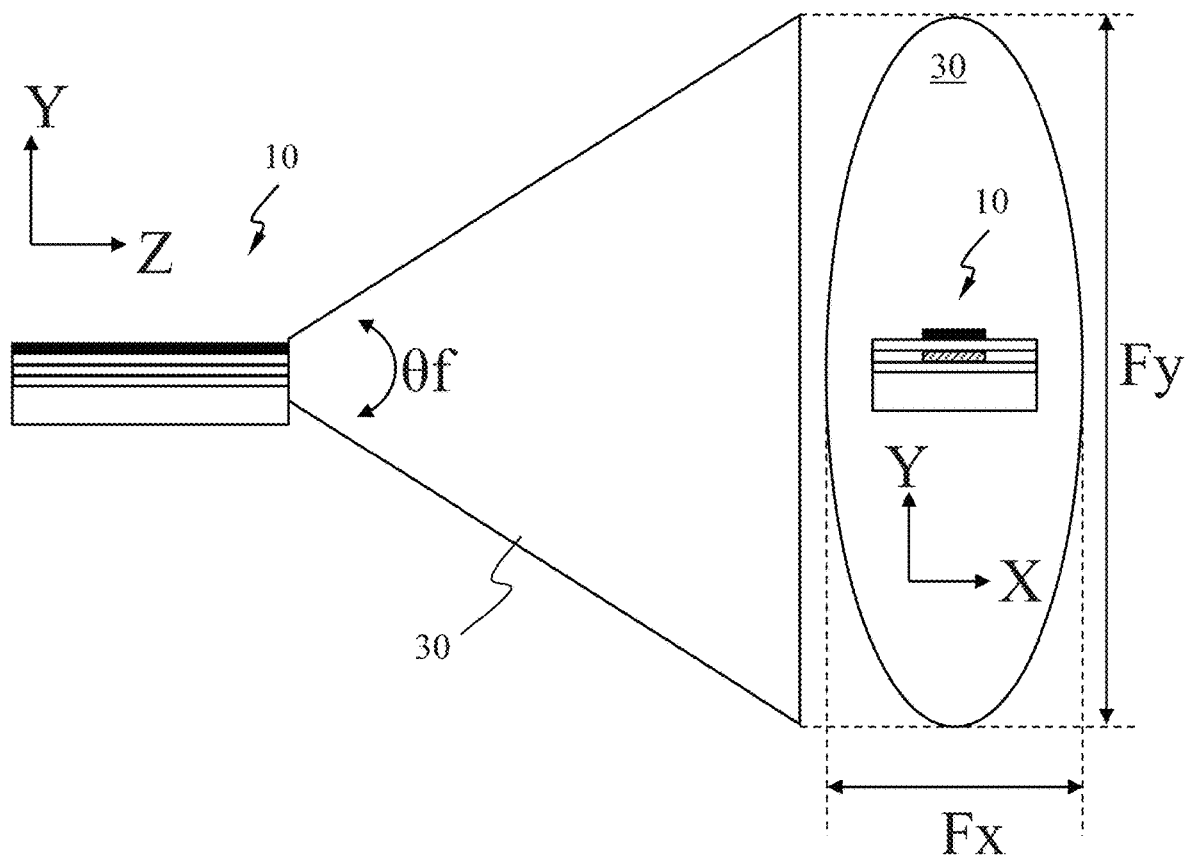
FIG. 2B is a side view schematically showing the divergence of the laser light 30. In the right part of FIG. 2B, a front view of the semiconductor laser device 10 as viewed from the positive direction of the Z-axis is also shown for reference.
Figure 2C:
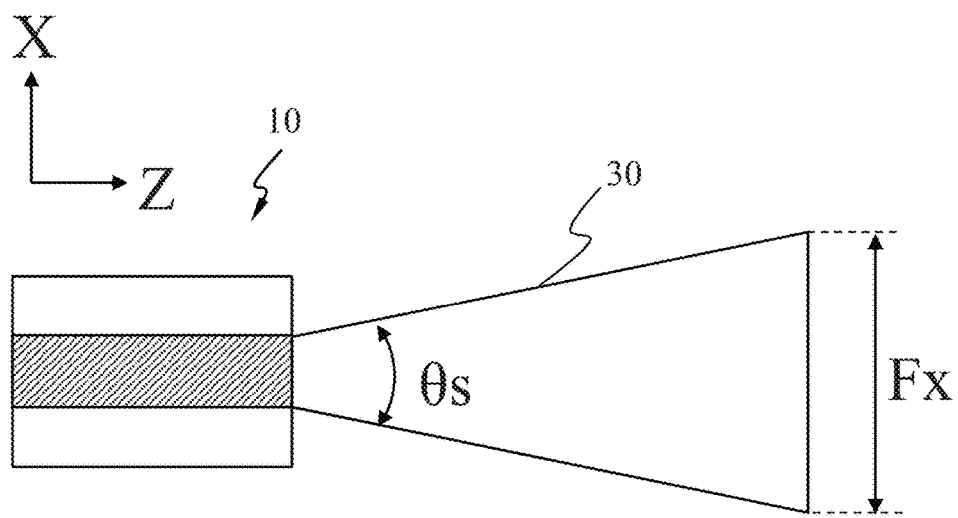
FIG. 2C is a top view schematically showing the divergence of the laser light 30.

FIG. 2A is a perspective view schematically showing the spread (divergence) of laser light 30 coming out from the emission region 24 of the semiconductor laser device 10. FIG. 2B is a side view schematically showing the divergence of the laser light 30. FIG. 2C is a top view schematically showing the divergence of the laser light 30. In the right part of FIG. 2B, a front view of the semiconductor laser device 10 as viewed from the positive direction of the Z-axis is also shown for reference.

The size in the Y-axis direction of a cross section of the laser light 30 is defined by length Fy, and the size in the X-axis direction of the cross section is defined by length Fx. Fy is the FWHM (Full Width at Half Maximum) in the Y-axis direction relative to the light intensity of the laser light 30 on the optical axis in a plane intersecting with the optical axis of the laser light 30. Likewise, Fx is the FWHM in the X-axis direction relative to the light intensity of the laser light 30 on the optical axis in the above-described plane.

The divergence of the laser light 30 in the Y-axis direction is defined by angle θf. The divergence of the laser light 30 in the X-axis direction is defined by angle θs. θf is the full angle at half maximum in the YZ plane relative to the light intensity of the laser light 30 at the intersection of a spherical surface equidistant from the center of the emission region 24 with the optical axis of the laser light 30. Likewise, θs is the full angle at half maximum in the XZ plane relative to the light intensity of the laser light 30 at the intersection of a spherical surface equidistant from the center of the emission region 24 with the optical axis of the laser light 30.

Figure 2D:
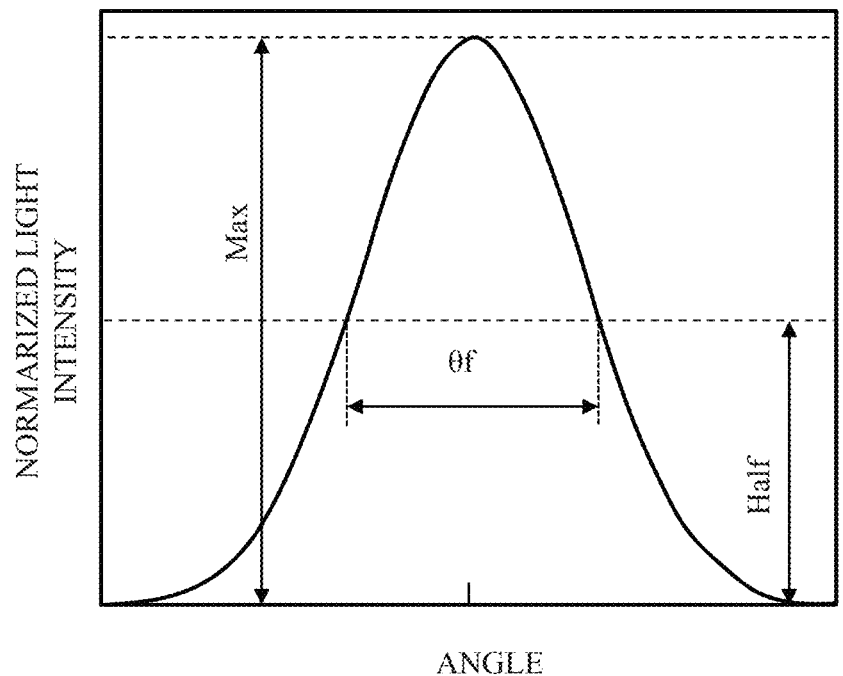
FIG. 2D is a graph representing the divergence of the laser light 30 in the Y-axis (fast axis) direction.
Figure 2E:
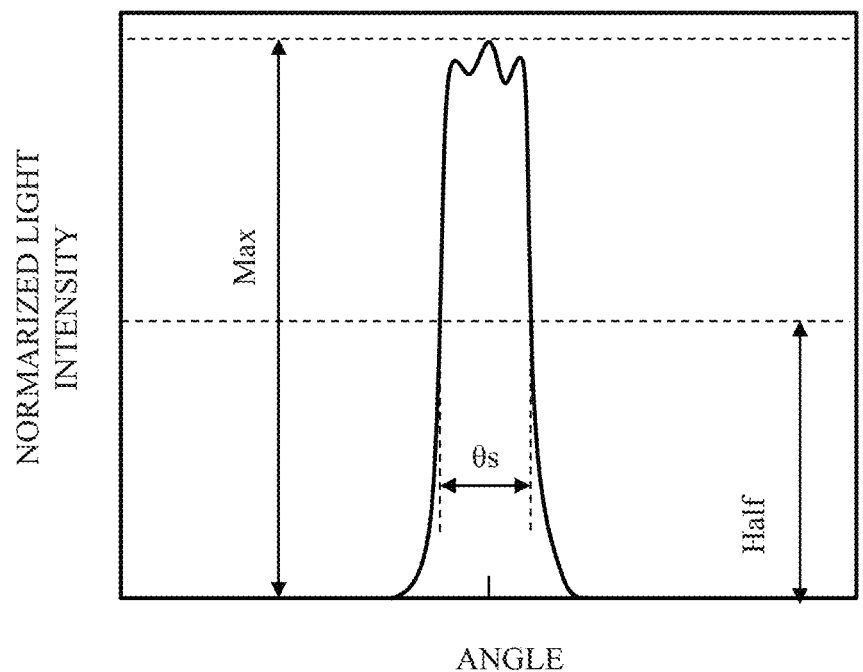
FIG. 2E is a graph representing the divergence of the laser light 30 in the X-axis (slow axis) direction.

FIG. 2D is a graph representing an example of the divergence of the laser light 30 in the Y-axis direction. FIG. 2E is a graph representing an example of the divergence of the laser light 30 in the X-axis direction. In the graphs, the vertical axis represents the normalized light intensity, and the horizontal axis represents the angle. The light intensity of the laser light 30 exhibits a peak value on the optical axis which is parallel to the Z-axis. As seen from FIG. 2D, the light intensity in a plane which includes the optical axis of the laser light 30 and which is parallel to the YZ plane generally exhibits a Gaussian distribution. Meanwhile, the light intensity in a plane which includes the optical axis of the laser light 30 and which is parallel to the XZ plane exhibits a narrow distribution which has a relatively flat top as shown in FIG. 2E. In many cases, this distribution has a plurality of peaks which are attributed to multimode oscillation.

Lengths Fy, Fx which define the cross-sectional size of the laser light 30 and angles θf, θs which define the divergence of the laser light 30 can be defined differently from the above-described definitions.

As seen from the graphs, the divergence of the laser light 30 coming out from the emission region 24 is anisotropic. In general, the relationship of θf>θs holds. The reason why θf is large is that the size in the Y-axis direction of the emission region 24, Ey, is not more than the wavelength of the laser light 30 and, therefore, strong diffraction occurs in the Y-axis direction. Meanwhile, the size in the X-axis direction of the emission region 24, Ex, is sufficiently greater than the wavelength of the laser light 30 so that diffraction is unlikely to occur in the X-axis direction.

Figure 3:
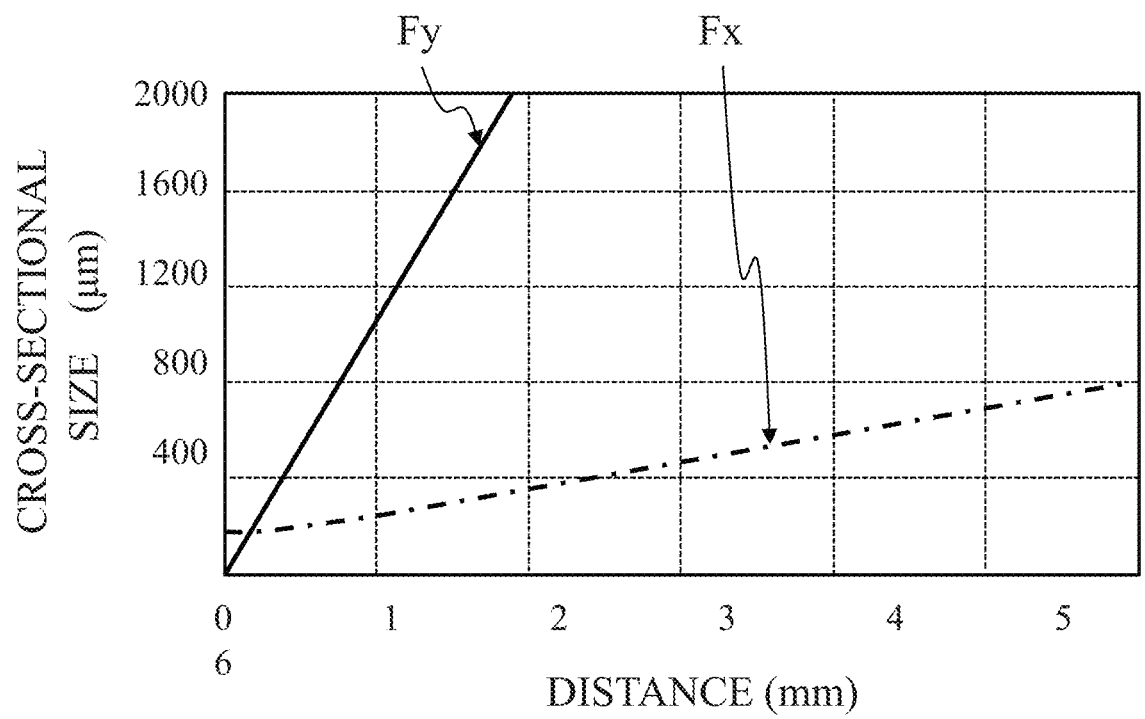
FIG. 3 is a graph representing an example of the relationship between the size in the Y-axis direction, Fy, and the size in the X-axis direction, Fx, of a cross section of the laser light 30 and the distance from the emission region 24 (the position in the Z-axis direction).

FIG. 3 is a graph representing an example of the relationship between the size in the Y-axis direction, Fy, and the size in the X-axis direction, Fx, of a cross section of the laser light 30 and the distance from the emission region 24 (the position in the Z-axis direction). As seen from FIG. 3, the cross section of the laser light 30 exhibits a near field pattern (NFP) which is relatively long in the X-axis direction in the vicinity of the emission region 24 but exhibits a far field pattern (FFP) which is elongated in the Y-axis direction at a position sufficiently distant from the emission region 24.

That it, the divergence of the cross section of the laser light 30 becomes "faster" in the Y-axis direction but "slower" in the X-axis direction as the distance from the emission region 24 increases. Thus, where the semiconductor laser device 10 is at the origin of the coordinate system, the Y-axis direction is referred to as "fast axis" direction, and the X-axis direction is referred to as "slow axis" direction.

In the laser diode arrays disclosed in Patent Documents Nos. 1 and 2, a collimation lens is provided near the emission region of the semiconductor laser device or laser bar in order to suppress the divergence of the light beam in the fast axis direction. Such a collimation lens is referred to as "fast axis collimation lens".

Figure 4A:
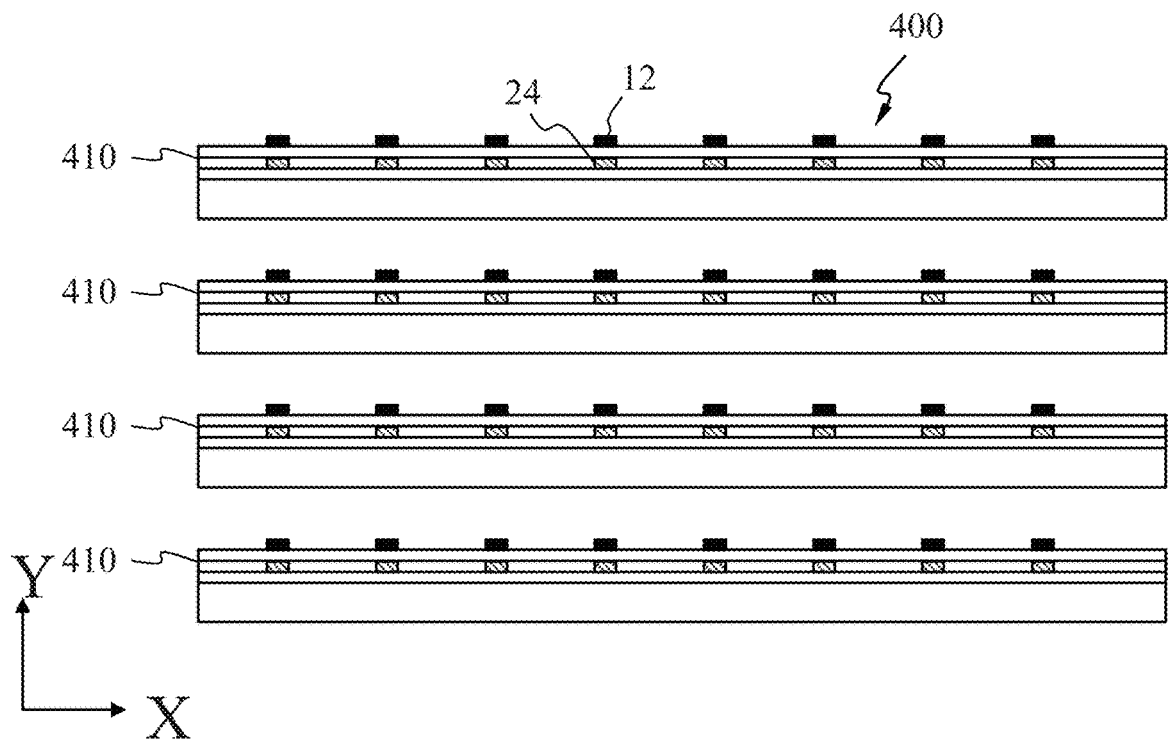
FIG. 4A is a front view showing a configuration example of a laser diode array as viewed from the positive direction of the Z-axis.
Figure 4B:
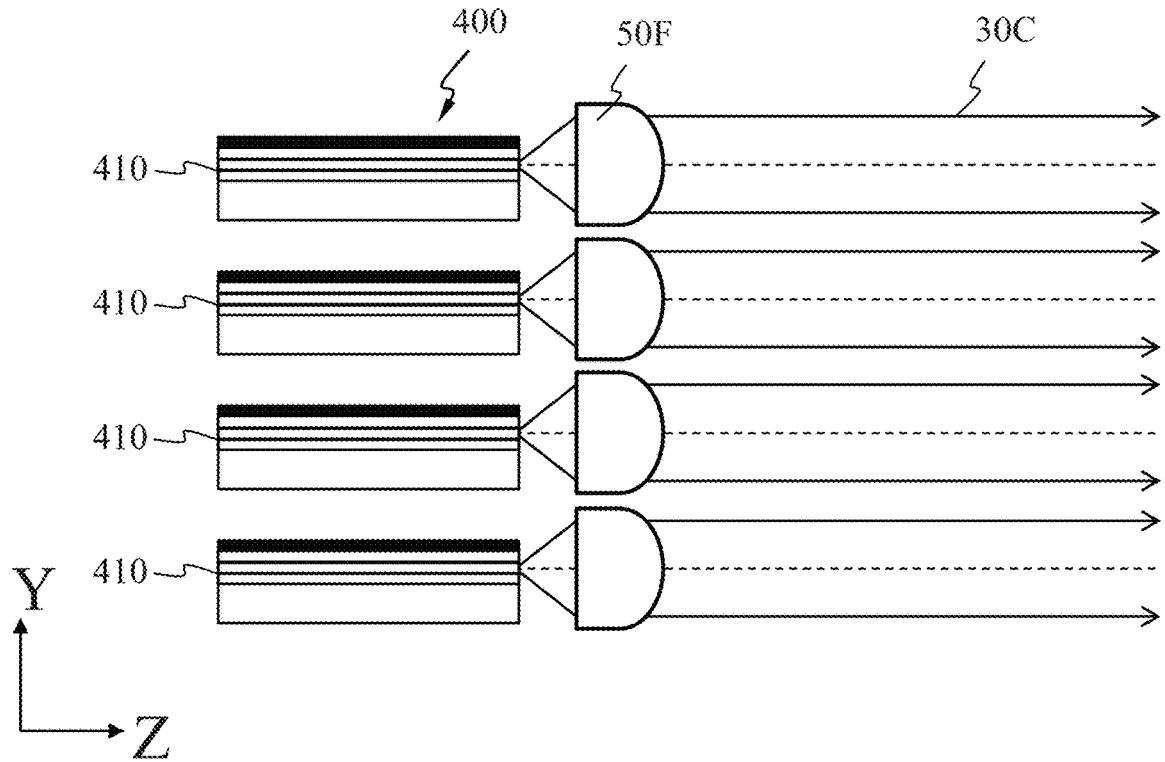
FIG. 4B is a diagram schematically illustrating the effect of fast axis collimation lenses 50F.

FIG. 4A is a front view showing a configuration example of a laser diode array 400 as viewed from the positive direction of the Z-axis. FIG. 4B is a diagram schematically illustrating the effect of the fast axis collimation lenses.

The laser diode array 400 illustrated in FIG. 4A is a vertical stack in which four laser bars 410 extending in the X-axis direction are stacked up in the Y-axis direction. Each of the laser bars 410 includes eight emission regions 24. In the illustrated laser diode array, laser light which has high light intensity in total is obtained from thirty-two emission regions 24 arranged in four rows and eight columns in the same plane. These emission regions 24 emit laser light concurrently based on an electric current flowing from the p-side electrode 12 in the shape of a stripe to an unshown n-side electrode.

In the example of FIG. 4B, the fast axis collimation lenses 50F are provided on the emission surface side of the laser bars 410. Each of the fast axis collimation lenses 50F typically has a shape elongated in the X-axis direction and faces a plurality of emission regions 24 of a corresponding one of the laser bars 410. The laser light 30 entering the fast axis collimation lens 50F is collimated into parallel laser light 30C. Laser light coming out from a laser diode array in which a large number of radiants are compactly arranged in a rectangular region and which is bright in the shape of a plane is shaped using another optical system, whereby the light can be converted to a light beam which has various cross-sectional shapes. The pitch in the Y-axis direction of the laser bars 410 is, for example, from about 2 mm to about 5 mm. By compactly arranging a large number of emission regions 24 in a limited area, a planar laser light source of high luminance can be realized.

A line beam can also be formed using the above-described laser diode array. However, for shaping laser light emitted from a planar light source into a line beam which has a desired cross-sectional shape, a complicated optical system consisting of other lenses or mirrors is necessary in addition to the fast axis collimation lenses 50F. As a result, the apparatus becomes bulky, and the problem of misalignment in the optical system or the like arises.

The present inventor recognized a problem which arises in forming a line beam using a beam shaping technique after the "fast axis collimation" such as illustrated in FIG. 4B and carried out various examinations in order to find a solution to the problem. As a result, the present inventor found that a practical line beam can be formed by positively utilizing such a characteristic that light emitted from a semiconductor laser device spreads in the fast axis direction due to a diffraction effect, instead of the "fast axis collimation". The present inventor also found that modulation of the spatial intensity distribution can be added to scanning of the line beam by using the emission region of a semiconductor laser device as a component which is capable of adjusting the light intensity independently of the other semiconductor laser devices, rather than merely a part of a uniformly-emitting planar light source. It was also found that, particularly for laser lift-off purposes, high light intensity uniformity is not necessary unlike a line beam for melting and recrystallization of a non-crystalline silicon film. Rather, it was also found that it is desirable to spatially adjust the light intensity according to the structure of an object which is to be delaminated.

Embodiments

Hereinafter, embodiments of a line beam source and a line beam irradiation apparatus of the present disclosure and an embodiment of a laser lift-off method are described with reference to the drawings. Excessively detailed descriptions will sometimes be omitted. For example, detailed description of a well-known matter and repetitive descriptions of substantially identical components will sometimes be omitted. This is for the sake of precluding the following descriptions from being unnecessarily redundant and assisting one skilled in the art to easily understand the descriptions. The present inventor provides the attached drawings and the following descriptions for the purpose of assisting one skilled in the art to sufficiently understand the present disclosure. The present inventor does not intend that these drawings and descriptions limit the subject matter recited in the claims.

<Line Beam Source>

An embodiment of the line beam source of the present disclosure is not intended to function as a planar light source in which a large number of emission regions are compactly arranged at high density. Thus, a complicated optical system for shaping a light beam emitted from such a planar light source into a line beam is not necessary. The line beam source of the present disclosure is capable of forming a line beam elongated in the fast axis direction by effectively utilizing a characteristic of the semiconductor laser device, i.e., such a characteristic that a diffraction effect causes light beam to spread in the fast axis direction.

Figure 5:
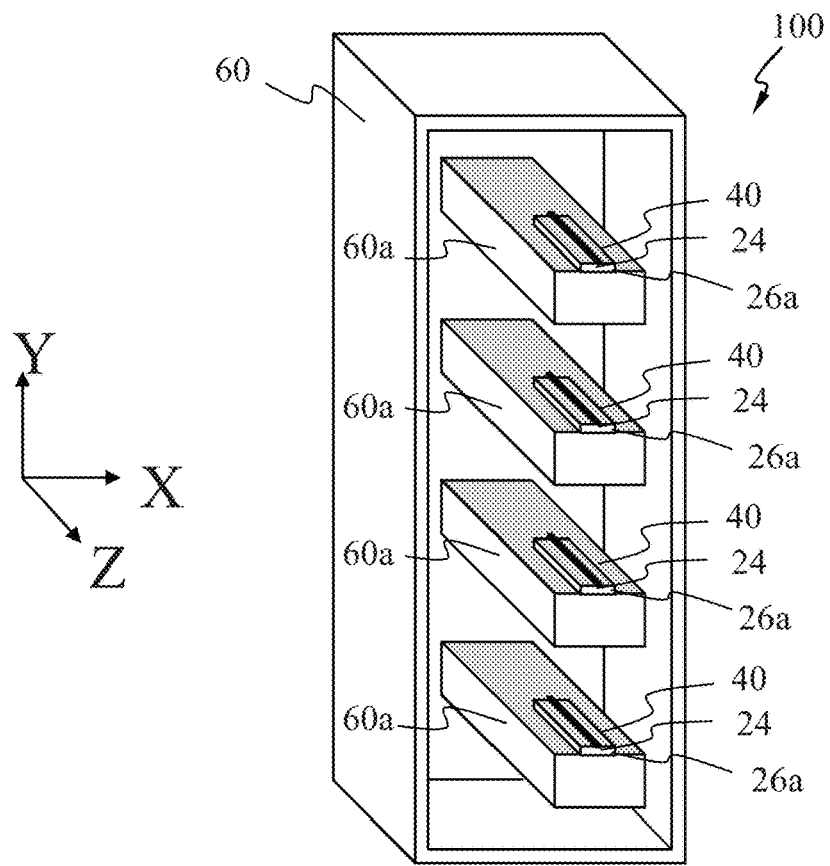
FIG. 5 is a perspective view showing a configuration example of a line beam source 100 in an embodiment of the present invention.
Figure 6:
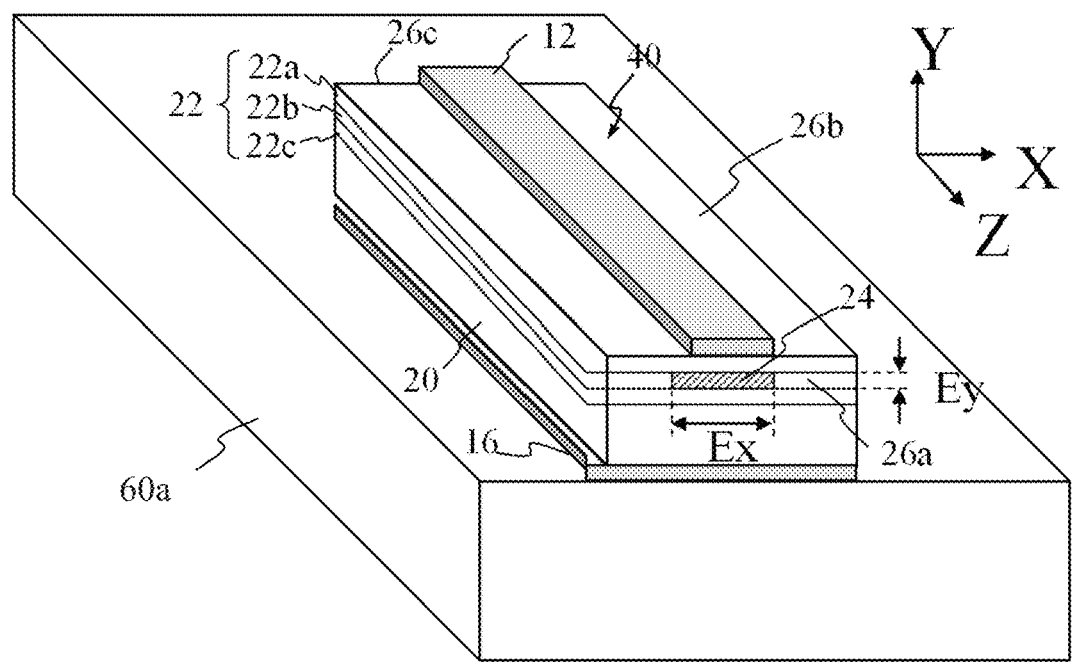
FIG. 6 is a perspective view showing a configuration example of a semiconductor laser device 40 in an embodiment of the present invention.

First, refer to FIG. 5 and FIG. 6. A nonlimiting exemplary embodiment of the line beam source of the present invention includes a plurality of semiconductor laser devices and a plurality of supports 60a supporting the semiconductor laser devices 40 as shown in FIG. 5. The plurality of semiconductor laser devices 40 are arranged along the same line extending in the fast axis direction (Y-axis direction). Laser light emitted from the emission regions 24 of respective ones of the semiconductor laser devices 40 diverge in parallel to the same line so as to form a line beam.

In the illustrated example, the number of semiconductor laser devices 40 is four. The number of semiconductor laser devices 40 is not limited to this example but may be three or may be not less than five. To form a long line beam for irradiating a large-area region, more than 100 semiconductor laser devices 40 can be arranged on the same line. In the case where a large glass substrate of, for example, about 300 cm on each side is irradiated through one scanning cycle, the length of the line beam needs to be set to about 300 cm. In this case, when the arrangement pitch is set to 20 mm (=2 cm), about 150 semiconductor laser devices 40 are arranged on the same line.

Each of the semiconductor laser devices 40 can have the same configuration as that of the semiconductor laser device 10 of FIG. 1 as shown in FIG. 6. Each of the plurality of semiconductor laser devices 40 includes a semiconductor multilayer stack 22 which has a facet 26a. The facet 26a includes an emission region 24 from which laser light is to be emitted. The emission region 24 of the semiconductor laser device 40 has a size Ey in the fast axis direction (Y-axis direction) that is parallel to the layer stacking direction of the semiconductor multilayer stack 22 and a size Ex in the slow axis direction (X-axis direction) that is perpendicular to the layer stacking direction. The aspect ratio (Ex/Ey) is not less than 50. In the semiconductor laser device 10 of FIG. 1 and the semiconductor laser device 40 of FIG. 6, corresponding components are designated with identical reference numerals. Herein, in principle, the description of common components will not be repeated.

The semiconductor laser device 40 can be made of various semiconductor materials and can have various configurations and sizes according to the oscillation wavelength and the optical output. When the laser light is required to have a wavelength in the ultraviolet region (e.g., 300-350 nm), the semiconductor multilayer stack 22 of the semiconductor laser device 40 can be suitably made of a nitride semiconductor, such as AlGaN-based semiconductor or InAlGaN-based semiconductor. To define the size in the slow axis direction of the emission region 24, Ex, a ridge stripe may be provided in the p-side cladding layer 22a such that light confinement in the horizontal transverse direction is realized. The active layer 22b may include a single or a plurality of quantum well structures. The semiconductor multilayer stack 22 may include other semiconductor layers, such as a light guiding layer, a buffer layer, and a contact layer. When the substrate 20 is a sapphire substrate, the n-side electrode 16 is provided on a side of the substrate 20 on which the p-side electrode 12 is provided.

In the present embodiment, the size in the fast axis direction of the emission region 24, Ex, can be set to, for example, 10 nm to 200 nm, and the size in the slow axis direction of the emission region 24, Ey, can be set to, for example, 50 μm to 300 μm. Ey can exceed 100 times Ex. As a result, angle θf that defines the divergence of the laser light 30 in the Y-axis direction is, for example, 40-60°, and angle θs that defines the divergence of the laser light 30 in the X-axis direction is, for example, 5-15°. The oscillation wavelength of the semiconductor laser device 40 can be set within the range of, for example, 350 nm to 450 nm. If a semiconductor laser device which can realize stable laser oscillation in a shorter-wavelength region, for example, in a deep ultraviolet region, is available, beam laser whose wavelength is 200 nm to 350 nm can be formed. Accordingly, the line beam source can replace the ELA unit in a broad range of uses.

The supports 60a may be suitably made of a conductor of high thermal conductivity, e.g., a metal such as copper or a ceramic material such as aluminum nitride. The semiconductor laser devices 40 may be mounted to the supports 60*a* while the semiconductor laser devices 40 are held on an unshown submount. In this example, all the supports 60*a* are held in a casing 60. The casing 60 is closed with, for example, an unshown light-transmitting cover, whereby the inside of the casing 60 can be shielded from the atmosphere. The inside of the casing 60 is filled with a gas which is inert with the semiconductor laser devices 40. Each of the semiconductor laser devices 40 is supplied with electric power via an unshown wire (metal wire, metal ribbon, or the like). To suppress increase of the temperature of the semiconductor laser devices 40 during operation, a thermoelectric cooling device (not shown) such as Peltier device may be provided near the semiconductor laser devices 40. The supports 60*a* may include an internal channel for water cooling and fins for air cooling.

In each of the semiconductor laser devices 40, an unshown photodiode is provided near a facet 26*c* of the semiconductor laser device 40 which is opposite to the emission-side facet 26*a*. Although this facet 26*c* is covered with a reflective film which has a relatively-high reflectance, part of laser light oscillating inside the semiconductor laser device 40 leaks out from the facet 26*c*. This laser light leakage is detected by the photodiode, whereby the intensity of laser light emitted from the facet 26*a* can be monitored. The output of the photodiode is sent to a driving circuit for the semiconductor laser device 40, which will be described later, and then used for power control.

Figure 7A:
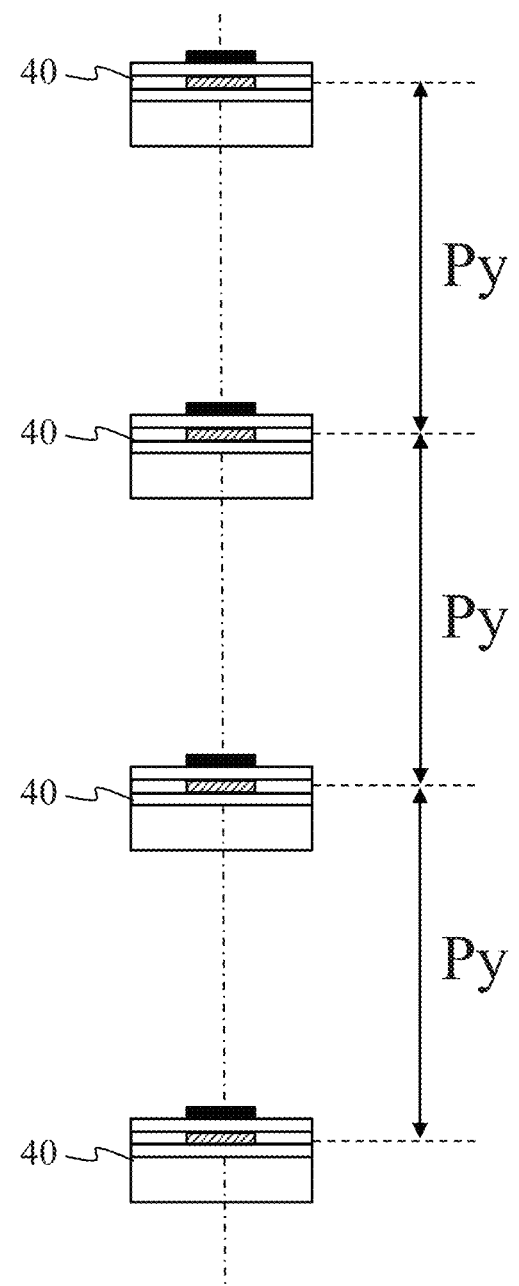
FIG. 7A is a front view of the four semiconductor laser devices 40 shown in FIG. 5 as viewed from the positive direction of the Z-axis.
Figure 7B:
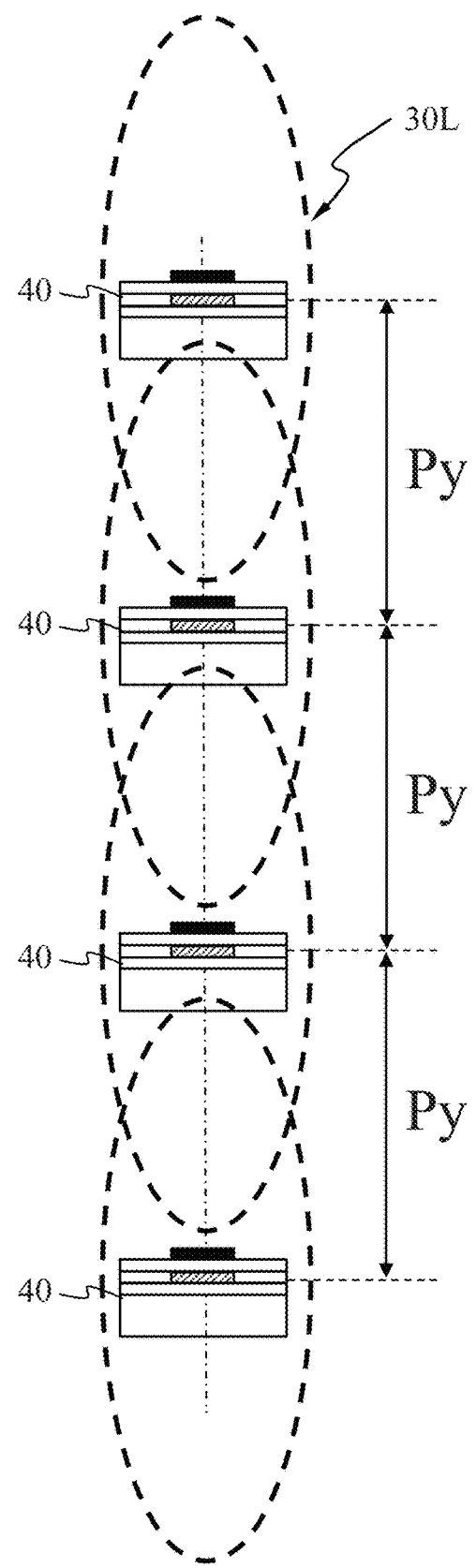
FIG. 7B is a front view of line beams 30L from the semiconductor laser devices 40 as viewed from the positive direction of the Z-axis.
Figure 7C:
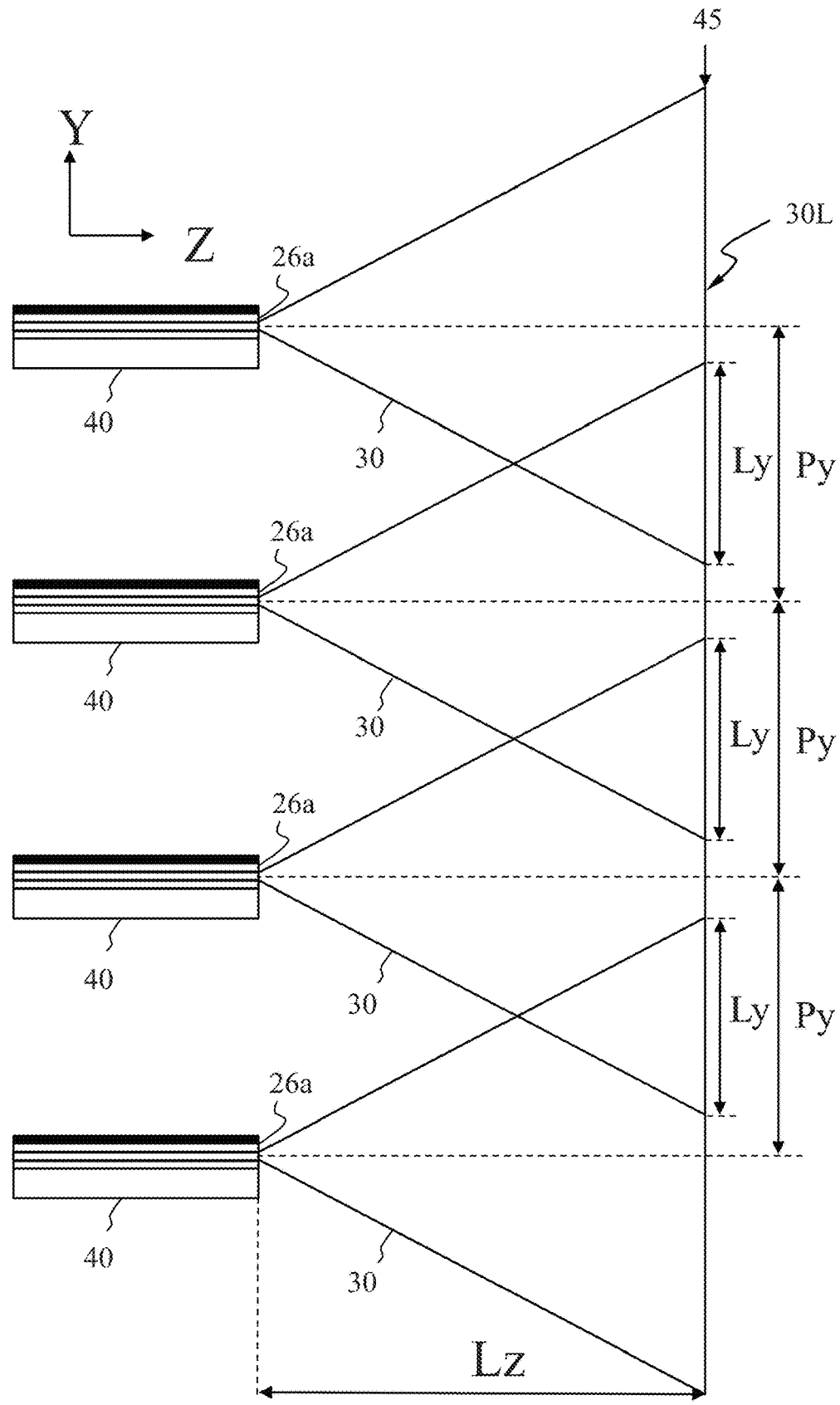
FIG. 7C is a side view showing that the laser light 30 emitted from the semiconductor laser devices 40 form a line beam 30L.

FIG. 7A is a front view of the four semiconductor laser devices 40 shown in FIG. 5 as viewed from the positive direction of the Z-axis. The arrangement pitch of the semiconductor laser devices 40 in the fast axis direction is Py. The arrangement pitch is defined by the distance between the centers of the emission regions 24. For simplicity, the supports 60*a* are not shown. FIG. 7B is a front view of line beams 30L from the semiconductor laser devices 40 as viewed from the positive direction of the Z-axis. FIG. 7C is a side view showing that the laser light 30 emitted from the semiconductor laser devices 40 form a line beam 30L.

As seen from FIG. 7C, by adjusting the arrangement pitch Py of the semiconductor laser devices 40 in the fast axis (Y-axis) direction and the distance Lz from the facet 26*a* to an irradiated surface 45, the overlapping length Ly of the laser light 30 in the line beam 30L on the irradiated surface 45 can be controlled.

Figure 8A:
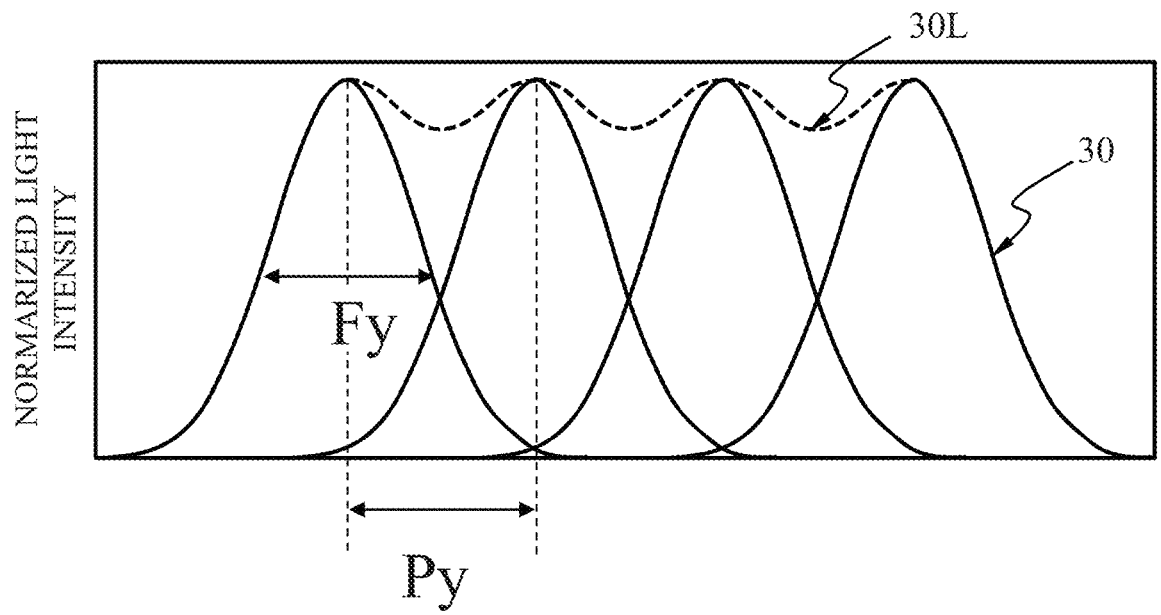
FIG. 8A is a graph schematically representing an example of the light intensity distribution in the fast axis direction of the line beam 30L formed by merging together the laser light emitted from the four semiconductor laser devices 40.

FIG. 8A is a graph schematically representing an example of the light intensity distribution at the irradiated surface 45 of the line beam 30L formed by merging together the laser light emitted from the four semiconductor laser devices 40. The laser light 30 emitted from each of the semiconductor laser devices 40 approximately has a Gaussian distribution along the fast axis direction. As seen from FIG. 8A, adjoining laser light 30 overlap each other such that a resultant single line beam 30L has uniform light intensity. The peak positions of the laser light 30 occur at intervals of the arrangement pitch Py of the semiconductor laser devices 40. The peak positions of the laser light 30 do not depend on the distance Lz from the facet 26*a* of the semiconductor laser devices 40 to the irradiated surface 45, but the shape of the light intensity distribution varies depending on the distance Lz.

When the distance Lz is constant and the arrangement pitch Py is set to a sufficiently small value, laser light 30 emitted from three or more semiconductor laser devices 40 adjoining one another on the same line can overlap one another on the irradiated surface 45. As the arrangement pitch Py decreases, the light intensity distribution in the Y-axis direction of the line beam 30L becomes more uniform. In the case of forming a line beam which has an equal size (length) in the long axis direction, a desired irradiation density can be achieved even if the power of each of the semiconductor laser devices is set to a value sufficiently lower than the maximum power value because the number density of semiconductor laser devices arranged along the same line increases as the arrangement pitch Py decreases. This contributes to extension of the life of the semiconductor laser devices.

Figure 8B:
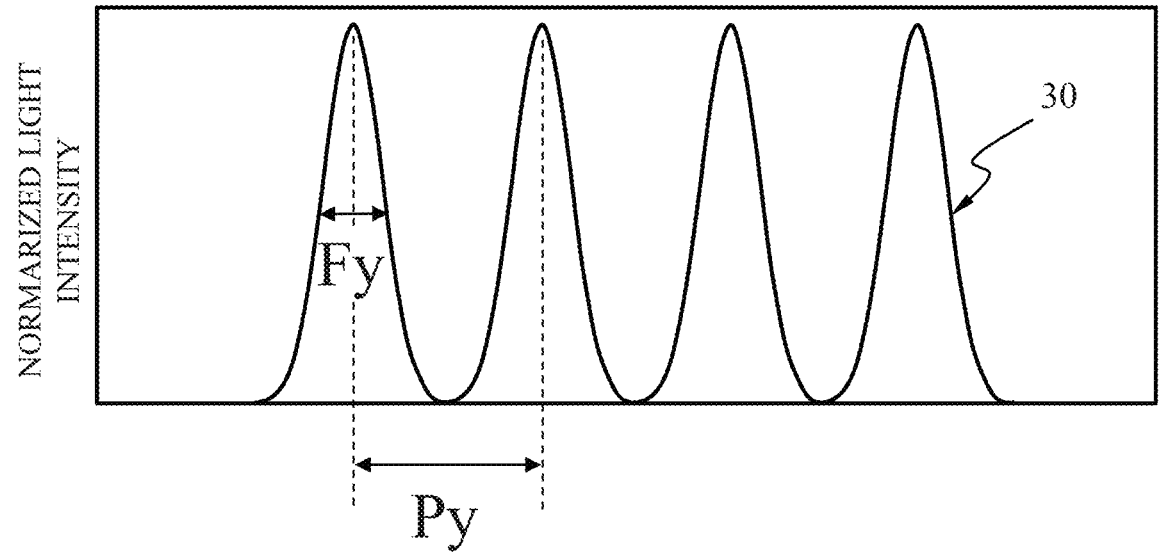
FIG. 8B is a graph schematically representing an example of the light intensity distribution in the fast axis direction of the laser light emitted from the four semiconductor laser devices 40.

FIG. 8B represents an example of the light intensity distribution at the irradiated surface 45 when the distance Lz from the facet 26*a* of the semiconductor laser devices 40 to the irradiated surface 45 is set to an extremely small value. In this example, at the irradiated surface 45, laser light 30 emitted from respective ones of the semiconductor laser devices 40 do not substantially overlap one another. In the intensity distribution shown in FIG. 8B, it is not recognized that a continuous "line beam" is formed. In a preferred embodiment, the line beam exhibits such a light intensity distribution that the minimum values occurring between the peaks of the light intensity are not less than half the peak intensity. Such a light intensity distribution is realized when the size Fy, which is defined by the FWHM of the laser light 30 emitted from each of the semiconductor laser devices 40, is not less than the arrangement pitch Py.

To increase the irradiation density (fluence; the unit is joule/cm$^2$) of the line beam 30L, it is preferred to decrease the arrangement pitch Py such that the number density of the semiconductor laser devices 40 is increased. However, in the present disclosure, rather than the effect achieved by decreasing the arrangement pitch Py, it is considered that the laser light 30 itself, which is emitted from each of the semiconductor laser devices 40, can work as a "line beam", and the properties of the laser light 30 are utilized. To this end, in a preferred embodiment of the present disclosure, the arrangement pitch Py is set to a large value as compared with the stack arrangement pitch in the conventional laser diode array previously described with reference to FIG. 4A and FIG. 4B. Specifically, the arrangement pitch Py is set to 20 mm or more. In one form, Py is set to 30 mm or more. In some uses, Py is set to 40 mm or more. The distance Lz from the facet 26*a* of the semiconductor laser device 40 to the irradiated surface 45 is set such that the laser light 30 overlap one another at the irradiated surface 45 to form a line beam 30L. By thus setting the arrangement pitch Py so as to be greater than in the conventional laser diode array, the following effects are obtained.

(1) A line beam 30L which has a given length can be formed by a smaller number of semiconductor laser devices 40. Furthermore, a line beam which has a light intensity distribution required for laser lift-off is sufficiently obtained.

(2) As the interval between adjoining semiconductor laser devices 40 increases, heat produced in each of the semiconductor laser devices 40 is more likely to dissipate to the outside. A configuration where a heat sink which is made of a material of high thermal conductivity is in contact with both the upper and lower surfaces of each of the semiconductor laser devices 40 can be readily employed.

(3) A dimensional clearance is secured for allowing the semiconductor laser devices 40 mounted to a package or cartridge to be placed on the supports 60*a* instead of placing the semiconductor laser devices 40 in the form of chips on the supports 60*a*. According to a configuration where the semiconductor laser devices 40 are detachably supported by the supports 60*a*, when one of the plurality of semiconductor laser devices 40 has a breakdown, the broken semiconductor laser device 40 can be selectively replaced by an operable semiconductor laser device.

Figure 9A:
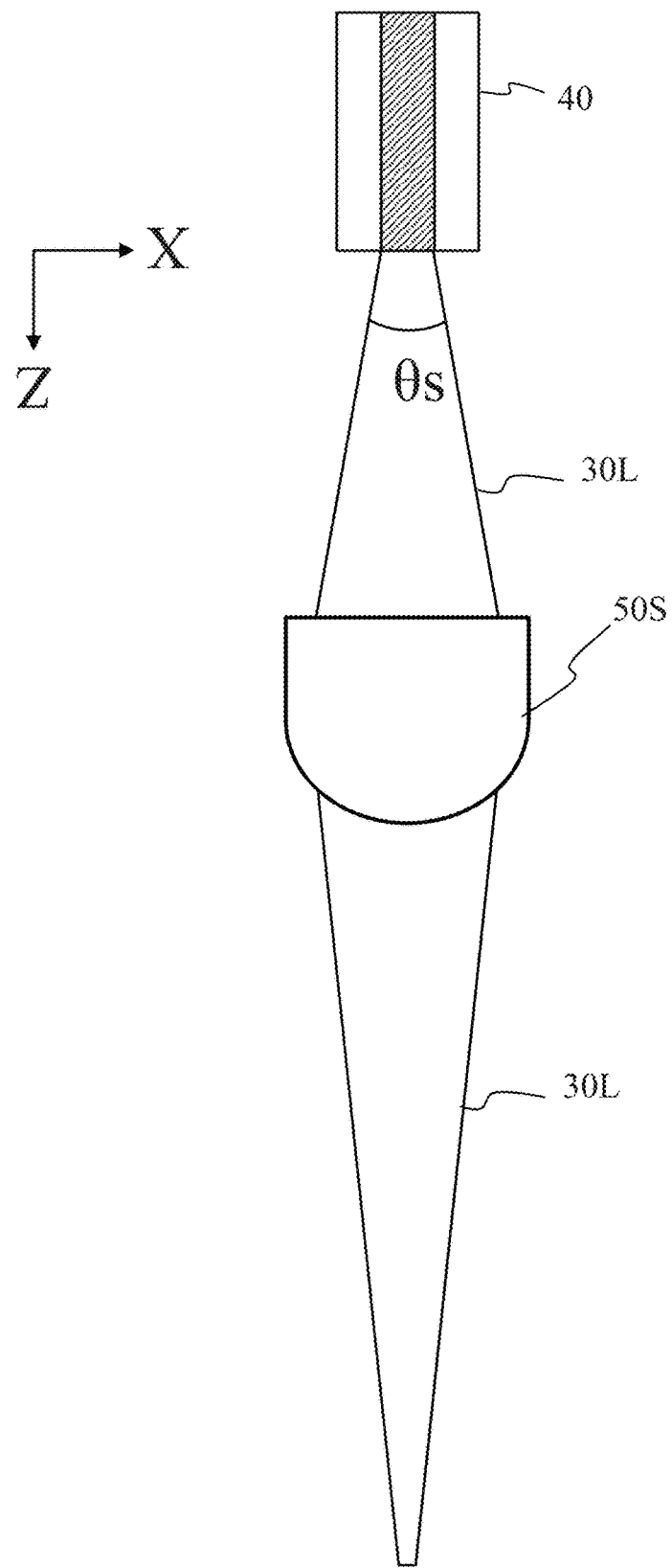
FIG. 9A is a diagram showing a configuration example which converges the line beam 30L in the slow axis direction, rather than the fast axis direction, using a cylindrical lens 50S.
Figure 9B:
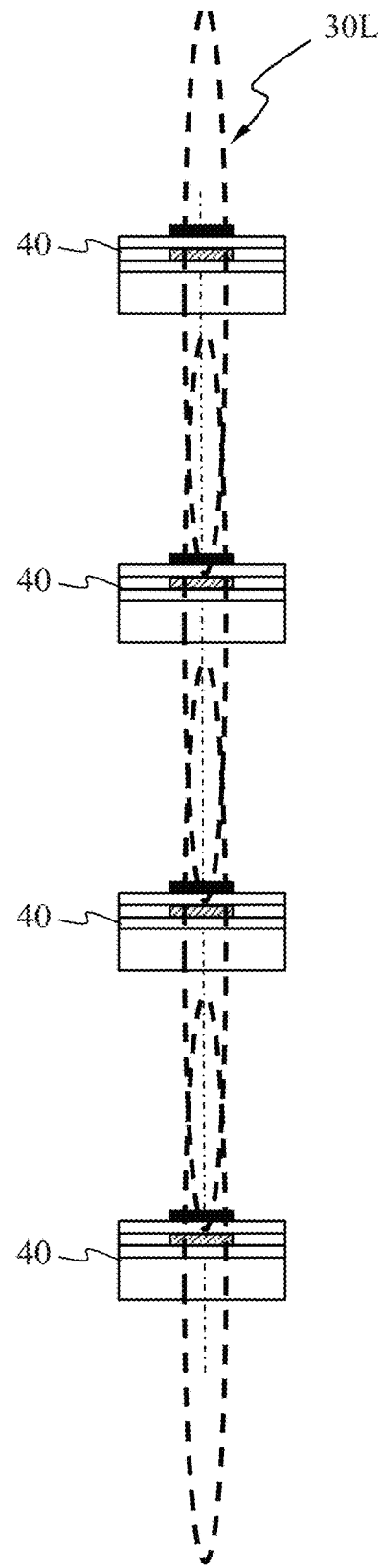
FIG. 9B is a diagram schematically showing a cross section of the line beam 30L with the width (the size in the slow axis direction) shortened by the cylindrical lens 50S.

FIG. 9A is a diagram showing a configuration example which converges the line beam 30L in the slow axis direction, rather than the fast axis direction, using a cylindrical lens 50S. FIG. 9B is a diagram schematically showing a cross section of the line beam 30L with the width (the size in the X-axis direction) shortened by the cylindrical lens 50S. The line beam source of the present disclosure does not collimate or converge laser light in the fast axis direction but does not exclude such shaping of the laser light in the slow axis direction. When the size in the slow axis direction (width) of the line beam 30L is shortened by a lens or the like, the irradiation density (fluence) at the irradiated surface can be improved.

In order to adjust the intensity distribution in the fast axis direction of the line beam, an optical part whose light transmittance, refractive index or optical thickness varies along the fast axis direction may be added on the optical path of the line beam 30L. Such an optical part does not substantially shorten the length (the size in the fast axis direction) of the line beam such that the irradiation density (fluence) is improved.

As described above, according to the line beam source of the present disclosure, the anisotropic spread (divergence) of the laser light exhibited by the semiconductor laser device can be efficiently utilized. Thus, this line beam source does not provide a planar light source which exhibits evened high luminance unlike the conventional laser diode array.

<Line Beam Irradiation Apparatus>

Figure 10:
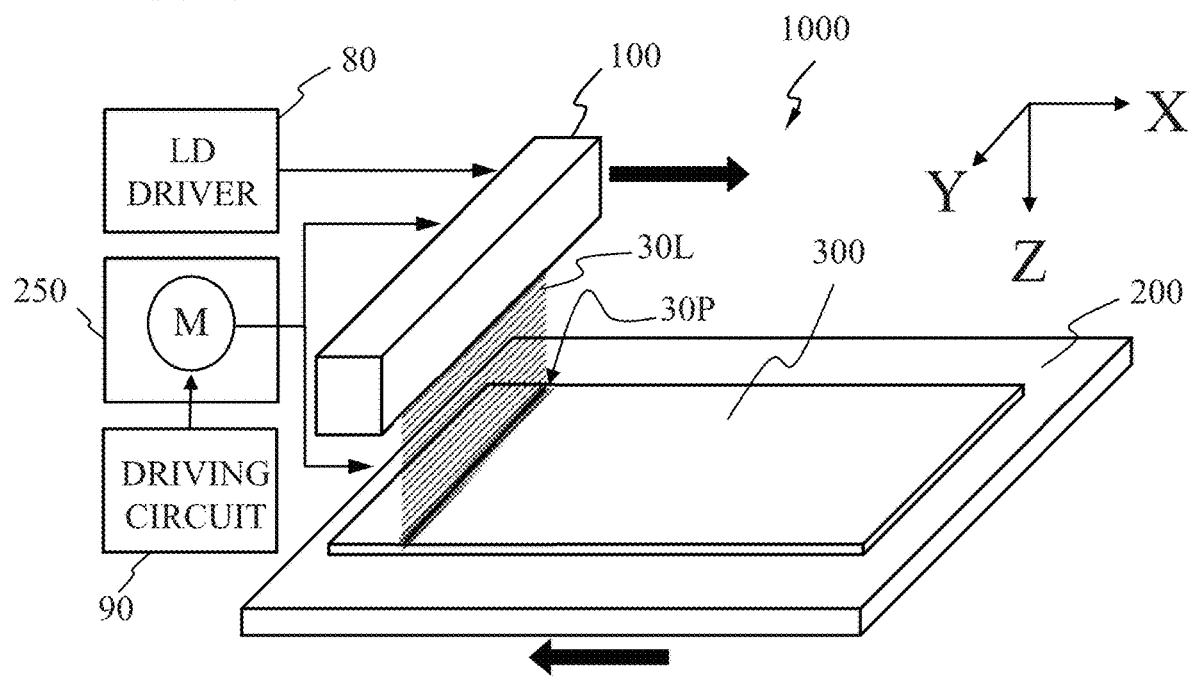
FIG. 10 is a perspective view schematically showing a configuration example of a line beam irradiation apparatus 1000 of the present embodiment.

See FIG. 10. FIG. 10 is a perspective view schematically showing a configuration example of a line beam irradiation apparatus 1000 of the present embodiment. The line beam irradiation apparatus 1000 includes a work stage 200 and a line beam source (laser head) 100 for irradiating a work 300 placed on the work stage 200 with line beam 30L. Typical examples of the work 300 include a flexible display and a high-luminance LED under manufacture, although the present invention is not limited to these examples. Examples of the work 300 include a wide variety of objects which can be physically or chemically changed by irradiation with the line beam 30L. Such a physical or chemical change can be utilized not only for delamination but also for processing of an object, reforming, melting, crystallization, recrystallization, cutting, activation of impurities in semiconductor, and sterilization.

The line beam irradiation apparatus 1000 includes a transporting device 250 for moving at least one of the work stage 200 and a line beam source 100 such that the irradiation position 30P of the line beam 30L on the work 300 moves in a direction transverse to the line beam 30L. The transporting device 250 includes an actuator such as, for example, a motor M. The motor M may be a rotating electric machine, such as DC motor, three-phase AC motor, stepping motor, or may be a linear motor or an ultrasonic motor. When an ultrasonic motor is used, highly-accurate positioning is possible as compared with the other types of motors. Further, the ultrasonic motor provides large holding power when it is not moving, and can hold without supply of electric power. Therefore, the heat generation is small when it is not moving. Further, the ultrasonic motor is particularly advantageous when the work is sensitive to magnetism because the ultrasonic motor does not include a magnet.

The transporting device 250 is connected with a transporting device driving circuit 90. The transporting device driving circuit 90 controls, for example, the rotation angle and the rotation speed of the motor M in order to adjust the mutual positional relationship between the line beam source 100 and the work stage 200. In an example described below, for simplicity, the line beam source 100 moves in the direction of the rightward arrow of FIG. 10 while the work stage 200 is stationary. However, the line beam irradiation apparatus 1000 of the present embodiment is not limited to this example. The work stage 200 may move in the direction of the leftward arrow of FIG. 10 while the line beam source 100 is stationary. Alternatively, both the work stage 200 and the line beam source 100 may move in an identical direction or in different directions. When the work stage 200 moves while the work stage 200 supports a heavy-weight work 300, a bearing such as, for example, air slider can be used.

As previously described with reference to FIG. 5, the line beam source 100 includes a plurality of semiconductor laser devices 40 and supports 60a supporting the plurality of semiconductor laser devices 40. The plurality of semiconductor laser devices 40 include the above-described constituents and are arranged along the same line extending in the fast axis direction. Laser light emitted from the emission regions of respective ones of the plurality of semiconductor laser devices 40 of the line beam source 100 diverge in parallel to the same line so as to form a line beam 30L.

The distance (interval) from the lower edge of the line beam source 100 to the upper surface of the work 300 can be set in the range of, for example, about 5 mm to about 200 mm. Although the upper surface of the work 300 shown in the drawing is flat, the upper surface of the actual work 300 does not need to be flat. In the example illustrated in FIG. 10, the line beam 30L is perpendicularly incident on the upper surface of the work 300. In other words, the optical axes of the laser light that are constituents of the line beam 30L are parallel to the Z-axis while the upper surface of the work stage 200 is parallel to the XY plane. However, the embodiment of the line beam irradiation apparatus of the present invention is not limited to such an example. The upper surface of the work stage 200 may be inclined with respect to the line beam 30L. The Z-axis does not need to be identical with the vertical direction but may be inclined with respect to (e.g., perpendicular to) the vertical direction.

To further even out the light intensity distribution illustrated in FIG. 8A along the longitudinal direction (Y-axis direction) of the line beam, the semiconductor laser devices 40 may be oscillated or moved along the longitudinal direction (Y-axis direction) of the line beam 30L during irradiation with the line beam. Such oscillation or movement can also be realized by driving the line beam source 100 itself using an unshown actuator. Alternatively, it can also be realized by oscillating or moving each of the semiconductor laser devices 40 in the fast axis direction in the line beam source 100.

Each of the semiconductor laser devices 40 in the line beam source 100 (see FIG. 5) is connected with a laser diode driving circuit (LD driving circuit) 80. The LD driving circuit 80 may include an automatic power control (APC) circuit which is configured to receive an electric signal from the above-described photodiode for monitoring and adjust the optical output of the semiconductor laser devices 40 (see FIG. 5) to a predetermined level. Alternatively, the LD driving circuit 80 may include an automatic current control (ACC) circuit which is configured to adjust the magnitude of an electric current (driving current) flowing through the semiconductor laser devices 40 (see FIG. 5) to a predetermined level. The LD driving circuit 80 can have a known circuit configuration. When strict irradiation control over the work is unnecessary, the photodiode for monitoring may be omitted from the semiconductor laser devices. In this case, the aforementioned ACC circuit is suitably used.

Figure 11:
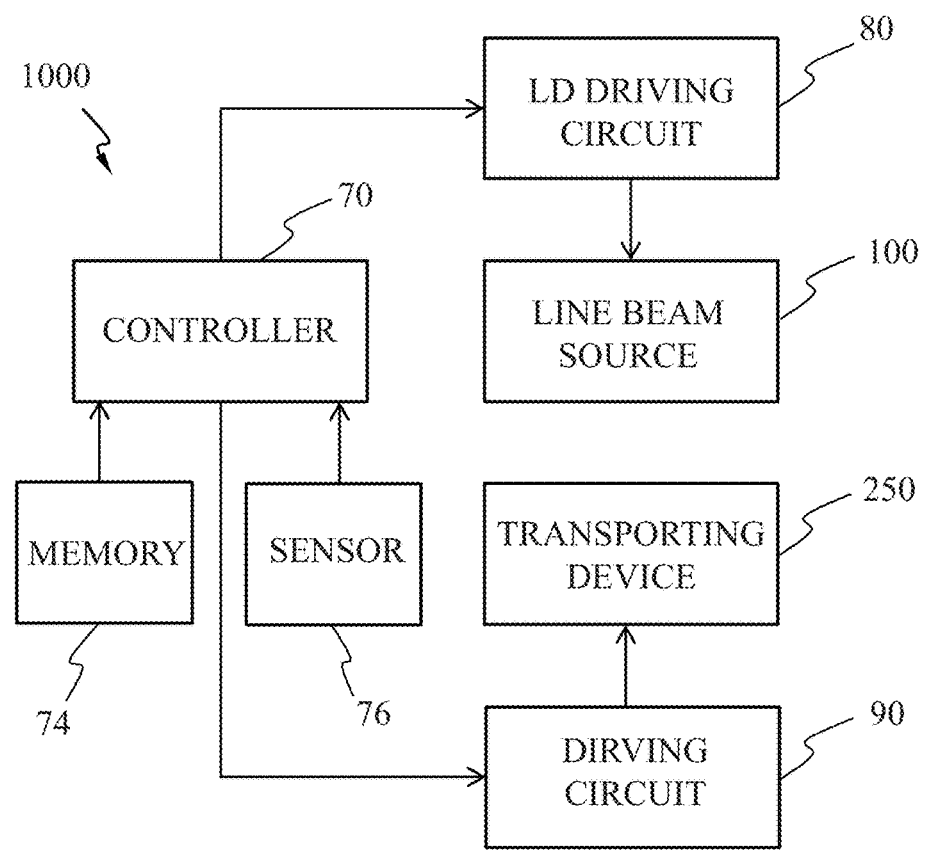
FIG. 11 is a block diagram schematically showing the flow of signals, data, and instructions in the line beam irradiation apparatus 1000.

FIG. 11 is a block diagram schematically showing the flow of signals, data, and instructions in the line beam irradiation apparatus 1000.

In the configuration example shown in the drawing, a controller 70 is typically a computer. A part or the entirety of the controller 70 can be a general-purpose or special-purpose computer system. The computer system includes an OS (operating system) and, when necessary, hardware devices such as peripheral devices. The controller 70 is connected with a memory 74 which is a computer-readable storage medium. In the memory 74, a program is stored which defines the operation of the line beam irradiation apparatus 1000. In FIG. 11, for simplicity, a single memory unit is shown. However, the actual memory 74 can consist of a plurality of storage devices of the same type or different types. A part of the memory 74 may be a nonvolatile memory while the other part may be a random access memory. A part or the entirety of the memory 74 may be an easily-detachable optical disc or solid-state storage device or may be a cloud-type storage on a network.

The controller 70 is connected with a sensor 76, such as temperature sensor and image sensor. Such a sensor 76 enables detection of the irradiation position 30P of the line beam 30L on the work 300 (FIG. 10) or monitoring of a physical or chemical change in the work 300 which is caused by irradiation. When the sensor 76 is an infrared image sensor, the sensor 76 also enables detection of the temperature distribution over the work 300 heated by irradiation with the line beam 30L. When the sensor 76 is a visible-light image sensor, the sensor 76 also enables detection of the in-plane distribution of a physical or chemical change in the work 300 which is caused by irradiation with the line beam 30L. Thus, when for example laser lift-off is carried out using the line beam irradiation apparatus 1000 of the present embodiment, it is also possible to detect whether or not delamination failure occurred and the place of the delamination failure using the sensor 76. If the image sensor is configured to obtain three-dimensional images, it is also possible to detect the three-dimensional distribution of a physical or chemical change in the work 300 which is caused by irradiation with the line beam 30L. Further, before the irradiation, it is also possible to grasp the structure of the work 300 and utilize the grasped structure in adjusting the irradiation conditions.

The controller 70 follows the program stored in the memory 74 and issues appropriate instructions to the LD driving circuit 80 and the transporting device driving circuit 90, when necessary, based on the output of the sensor 76. The LD driving circuit 80 adjusts the light intensity of the line beam 30L emitted from the line beam source 100 according to the instruction from the controller 70. The transporting device driving circuit 90 adjusts the operation of the transporting device 250 according to the instruction from the controller 70.

Figure 12:
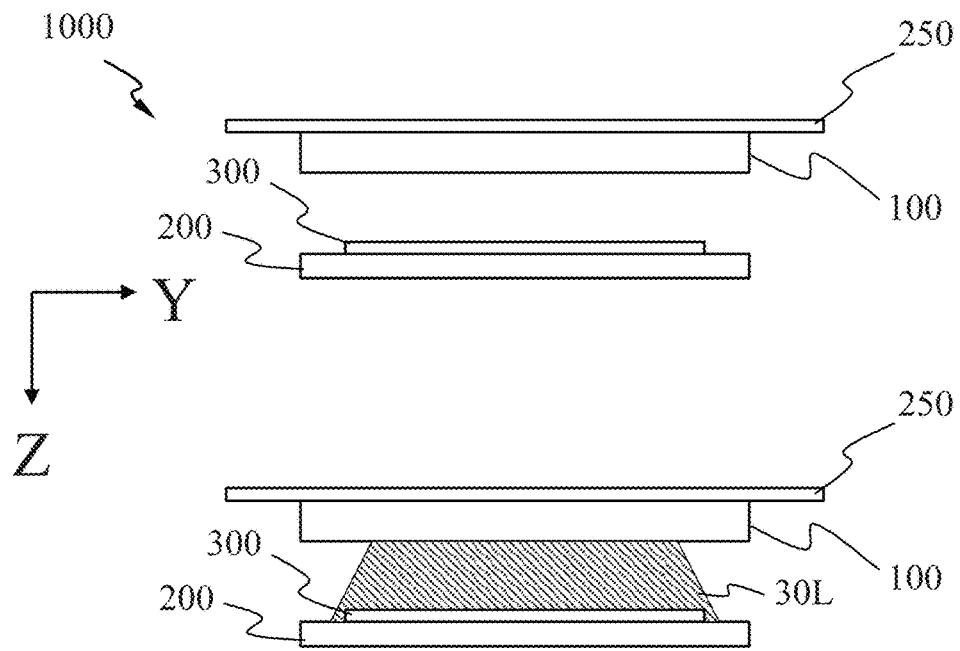
FIG. 12 (each of the upper and lower parts of FIG. 12) is a diagram of the line beam irradiation apparatus 1000 shown in FIG. 10 as viewed from a direction perpendicular to the YZ plane.

FIG. 12 is a diagram of the line beam irradiation apparatus 1000 shown in FIG. 10 as viewed from a direction perpendicular to the YZ plane. The upper part of FIG. 12 shows the line beam irradiation apparatus 1000 before the irradiation. The lower part of FIG. 12 shows the line beam irradiation apparatus 1000 during the irradiation. In this example, the length (the size in the long axis direction) of the line beam 30L is greater than the length of one side of the work 300. Therefore, line beam irradiation of the entirety of the work 300 can be completed through one scanning cycle. If the length of the line beam 30L is half the length of one side of the work 300, two scanning cycles are necessary. In this case, the scanning direction may be reversed between the forward movement and the backward movement. In the line beam irradiation apparatus 1000 of the present embodiment, the line beam 30L is not enlarged or contracted in the long axis direction using an optical element, such as beam expander or lens. Thus, the length of the line beam 30L is generally equal to the total length of the array of the semiconductor laser devices 40 in the line beam source 100 (FIG. 5). If the opposite end portions of the line beam 30L are unnecessary for the irradiation, the opposite end portions of the line beam 30L may be cut off by a blocking member inserted between the line beam source 100 and the work 300.

Figure 13:
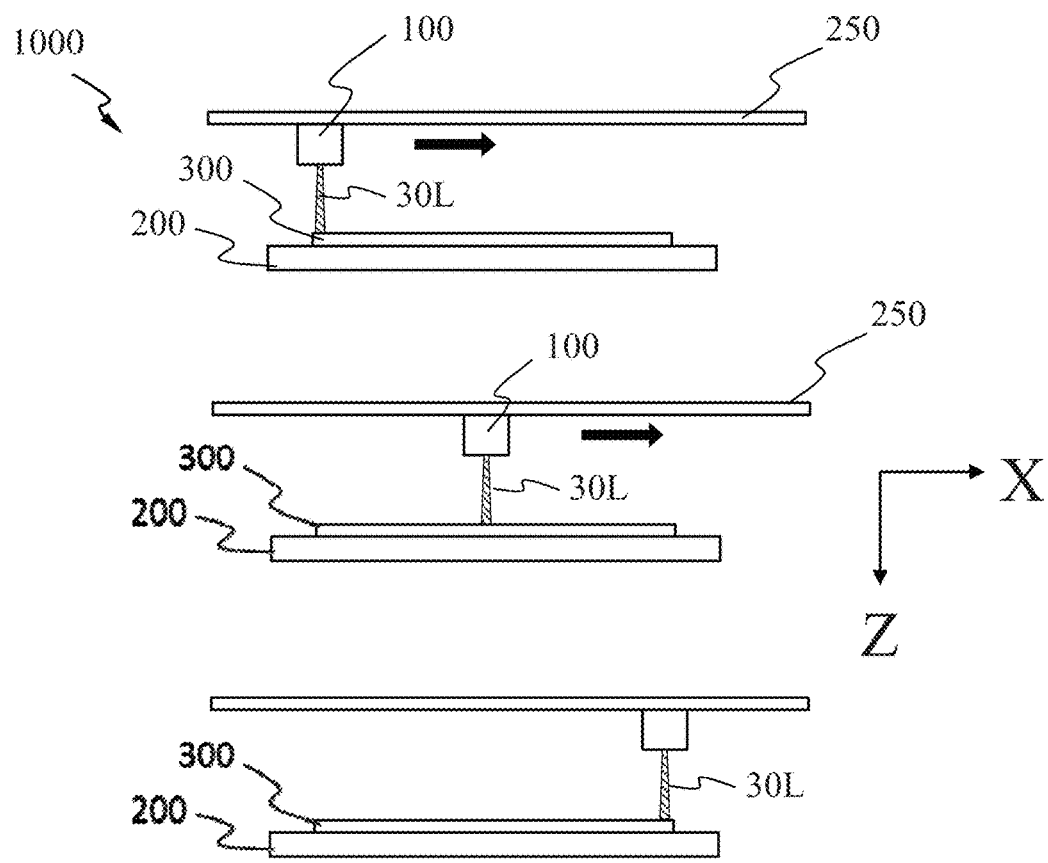
FIG. 13 is a diagram of the line beam irradiation apparatus 1000 as viewed from a direction perpendicular to the XZ plane in the step of scanning a work 300 with a line beam (at three phases (start, middle and end) of the step).

FIG. 13 is a diagram of the line beam irradiation apparatus 1000 as viewed from a direction perpendicular to the XZ plane in the step of scanning the work 300 with the line beam 30L (at three phases (start, middle and end) of the step). In this example, the scanning with the line beam 30L is realized by moving the line beam source 100 in the X-axis direction while the work 300 is stationary. As previously described, the scanning with the line beam 30L can be realized by changing the relative positional relationship between the line beam source 100 and the work stage 200.

The line beam 30L may be a continuous wave (CW) or may be a pulsed wave. The LD driving circuit 80 of FIG. 11 is capable of freely modulating emission of each of the semiconductor laser devices 40. As shown in FIG. 13, the light intensity of the line beam 30L can be temporally and spatially changed while the irradiation position of the line beam 30L is moving.

Figure 14:
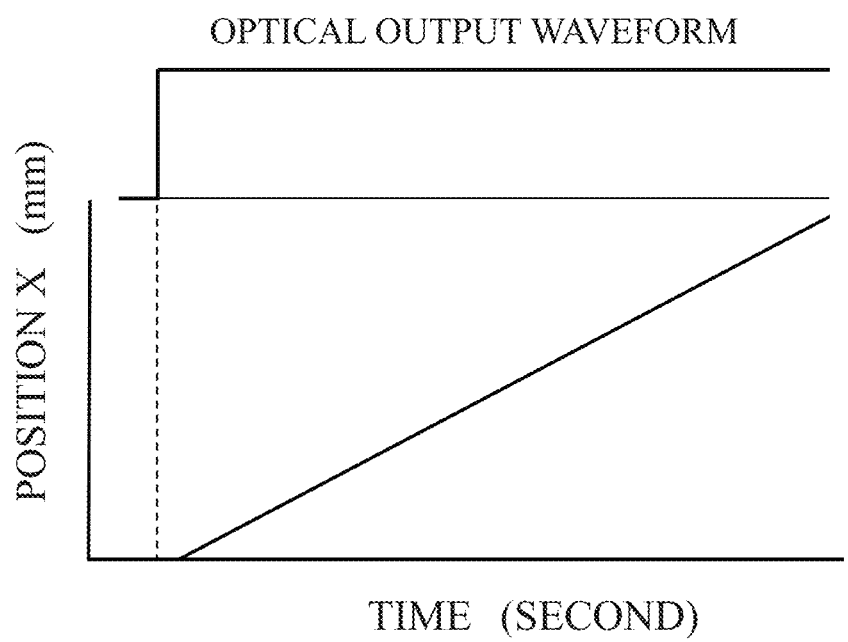
FIG. 14 is a graph representing an example of the relationship between the irradiation position of the line beam 30L and the optical output waveform.

FIG. 14 is a graph representing an example of the relationship between the position of the line beam source 100 and the light intensity variation (optical output waveform) of the line beam 30L. In this graph, a line sloping upwards to the right represents the relationship between the passage of time since the start of the line beam irradiation step and the position of the line beam source 100 (the position relative to the work). The position of the line beam source 100 is represented by the x coordinate for the sake of convenience. Above the graph, an example of the optical output waveform of the line beam 30L is shown. In the example of FIG. 14, the light intensity of the line beam 30L is maintained constant after the line beam source 100 is lit up. The position of the line beam source 100 moves at a constant scanning speed. In this case, the "constant scanning speed" is not limited to a constant speed by a continuous movement in a strict sense. For example, it includes moving the line beam source 100 or the work stage 200 in a step-by-step manner using a stepping motor, each step being several tens of micrometers. Such a microscopic step-by-step movement can be considered as being identical with a substantially continuous movement.

Consider an example where the optical output of each of the semiconductor laser devices 40 is 1 watt (W). Assume that the irradiated region on the work 300 by a single semiconductor laser device 40 has the size of 2.0 cm×0.5 cm. The area of the irradiated region is 1 $cm^2$. In this case, if the work 300 is irradiated with laser light from a single semiconductor laser device 40 for 1 second, the fluence is equal to 1 joule/$cm^2$ (=1000 millijoule/$cm^2$). Since the width of the line beam 30L is 0.5 cm, if the scanning is carried out in a direction perpendicular to the line beam 30L at the speed of 0.5 cm per second, the work 300 is irradiated with laser light of 1000 millijoule/$cm^2$. If the scanning is carried out in a direction perpendicular to the line beam 30L at the speed of 2.0 cm per second, the work 300 can be irradiated with laser light of 250 millijoule/$cm^2$. Since laser light emitted from respective ones of the semiconductor laser devices 40 partially overlap one another, the fluence of the line beam 30L increases by the amount of the overlaps. When the optical output of the semiconductor laser devices 40 is increased, the scanning speed can be further increased. In order to increase the optical output of the semiconductor laser devices 40, increasing the size in the slow axis direction of the emission region 24, Ex, is effective. Ex can be set to, for example, 100 µm or more, or 200 µm or more. In an embodiment of the laser lift-off method which will be described later, delamination of a polyimide layer from a glass substrate requires an irradiation density of about 250 millijoule/cm$^2$ or greater. Even when the optical output of the semiconductor laser devices 40 is relatively low, a required irradiation density can be achieved by increasing the irradiation duration. Alternatively, a required irradiation intensity can also be achieved by making the size in the short-axis direction (width) of the line beam smaller than 0.5 cm. To this end, an optical system such as lens or mirror may be coupled with each of the semiconductor laser devices 40. A sufficient size in the short-axis direction of the line beam is about 0.1 cm.

According to an embodiment of the line beam irradiation apparatus of the present invention, the price of a single unit of the apparatus can be decreased as compared with the ELA unit. Thus, when a plurality of units of the line beam irradiation apparatus are provided and each work is irradiated using each line beam irradiation apparatus, it is not necessary to increase the scanning speed to the limit level for the purpose of improving the mass production efficiency. That is, according to an embodiment of the line beam irradiation apparatus of the present invention, setting the scanning speed of the line beam to a long value is economically tolerated, and therefore, the life of the light source can be extended by setting the optical output of each semiconductor laser device to a low value.

Figure 15:
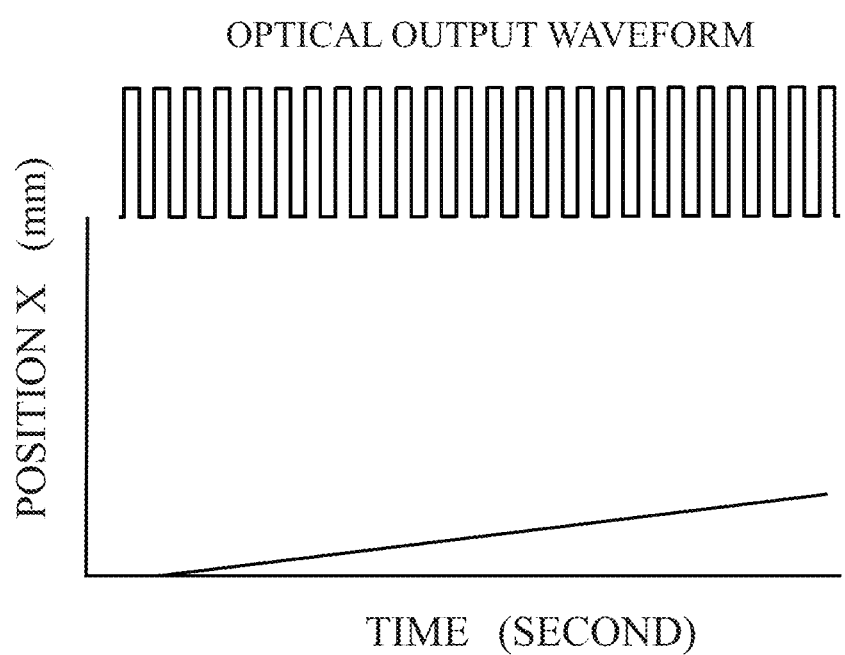
FIG. 15 is a graph representing another example of the relationship between the irradiation position of the line beam 30L and the optical output waveform.

FIG. 15 is a graph representing another example of the relationship between the position of the line beam source 100 and the optical output waveform. In the example of FIG. 15, after the line beam source 100 is lit up, the light intensity of the line beam oscillates with a constant short period. The position of the line beam source 100 moves at a constant, relatively-low speed. In this example, the line beam source 100 periodically alternates between a lit-up state and a dark state. The ratio of the duration of the lit-up state in one period is defined as the duty ratio. The fluence can be adjusted using the duty ratio as a parameter. The oscillation frequency (modulation frequency) of the light intensity can be set in the range of, for example, 1 hertz (Hz) to several kilohertz (kHz). The width of the line beam 30L (the size in the X-direction at the irradiated surface), the modulation frequency, and the scanning speed are set such that each region of the work 300 which is to be irradiated is subjected to the line beam irradiation at least once.

Figure 16:
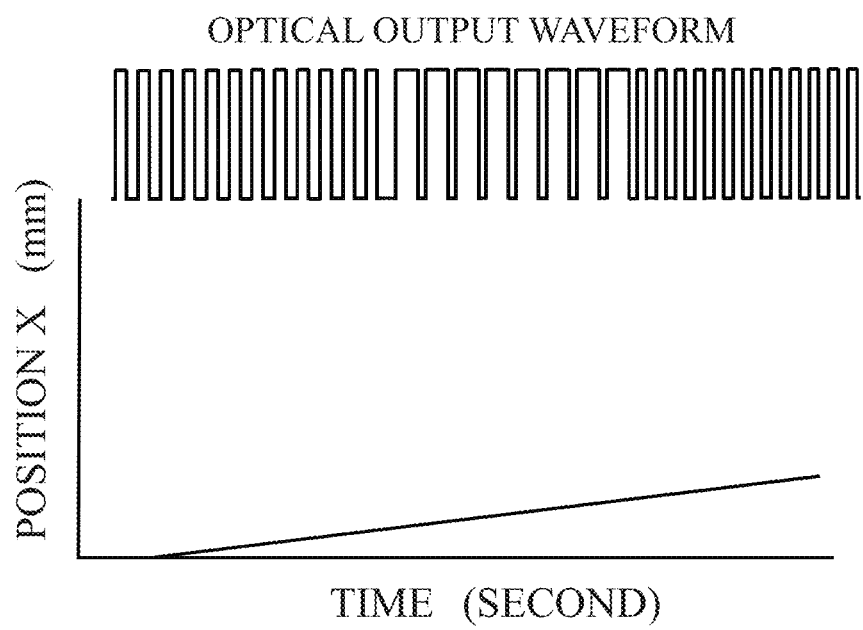
FIG. 16 is a graph representing still another example of the relationship between the irradiation position of the line beam 30L and the optical output waveform.

FIG. 16 is a graph representing still another example of the relationship between the position of the line beam source 100 and the optical output waveform. In the example of FIG. 16, the duty ratio is modulated during the scanning with the line beam 30L.

Figure 17:
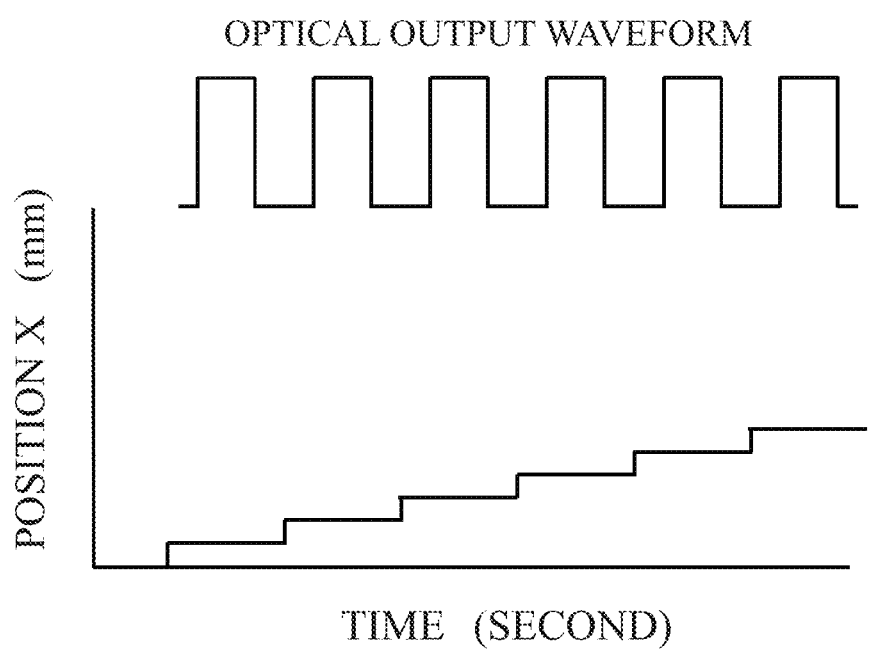
FIG. 17 is a graph representing still another example of the relationship between the irradiation position of the line beam 30L and the optical output waveform.

FIG. 17 is a graph representing still another example of the relationship between the position of the line beam source 100 and the optical output waveform. In the example of FIG. 17, the scanning speed is not constant, and the position of the line beam source 100 alternately moves and stops at constant time intervals. In this example, the irradiation with the line beam 30L is carried out while movement of the line beam source 100 relative to the work stage 200 is stopped. During the irradiation with the line beam 30L while the position in the X-axis direction of the line beam source 100 is stationary, the line beam 30L may be oscillated or moved in the fast axis (Y-axis) direction as previously described. Accordingly, at each region of the work 300, the distribution in the fast axis (Y-axis) direction of the irradiation density is evened out.

As described above, various modulations can be added to the light intensity of the line beam 30L. It is also possible to change the form of the modulation with time or according to the irradiation position. The combination of the pattern of movement of the irradiation position and the pattern of the light intensity modulation is various and is not limited to the examples illustrated in FIG. 14 to FIG. 17.

The distance between the line beam source 100 and the work 300 may be modulated although, in the above-described embodiments, this distance is maintained constant during the scanning. In these embodiments, laser light emitted from the semiconductor laser devices 40 of the line beam source 100 impinges on the work 300 without being collimated or converged at least in the fast axis direction. As previously described, a lens for converging the line beam 30L in the slow axis direction may be added to the line beam source 100. Further, for the purpose of adjusting the length of the line beam 30L, an optical element, such as lens or mirror, may be used to converge or expand the line beam 30L in the fast axis direction.

<Laser Lift-Off Method>

Figure 18A:
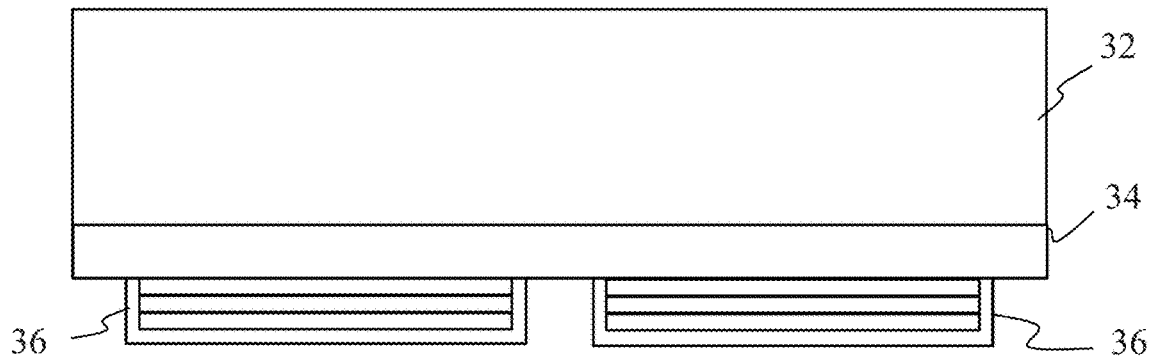
FIG. 18A is a cross-sectional view of a step for illustrating an embodiment of laser lift-off.
Figure 18B:
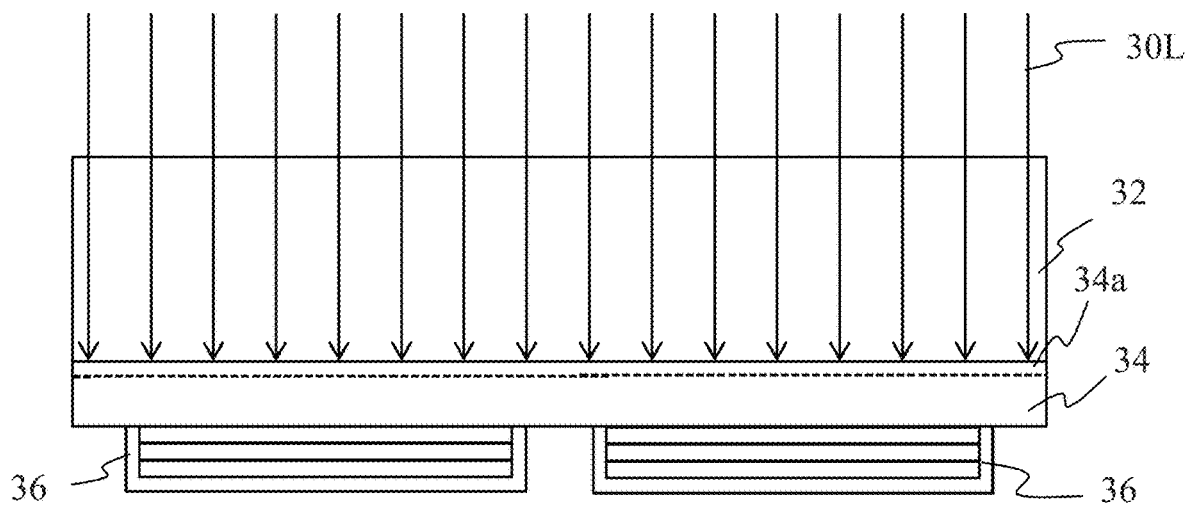
FIG. 18B is a cross-sectional view of a step for illustrating an embodiment of laser lift-off.
Figure 18C:
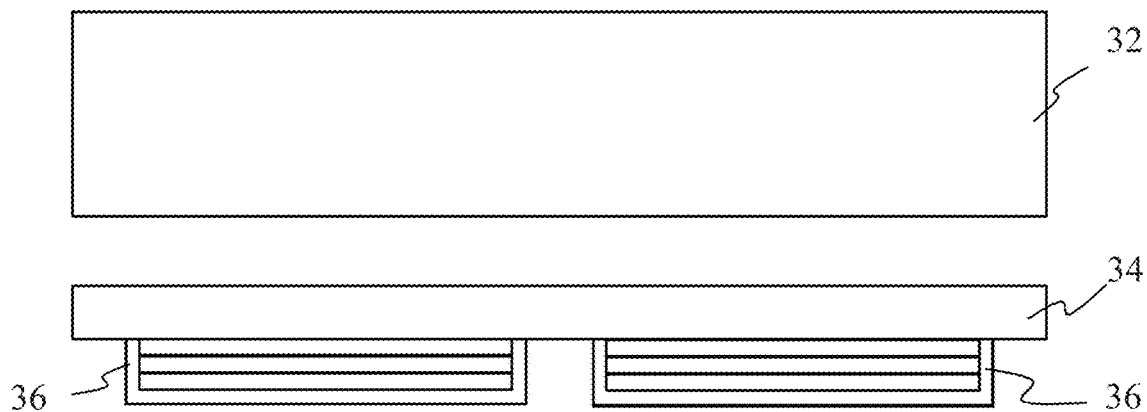
FIG. 18C is a cross-sectional view of a step for illustrating an embodiment of laser lift-off.

FIG. 18A, FIG. 18B and FIG. 18C are cross-sectional views of steps for illustrating an embodiment of the laser lift-off method of the present invention. Each of these drawings is a cross-sectional view enlargedly and schematically showing part of the work 300. The dimensions of the work 300 shown in the drawings do not reflect the scale ratio of the dimensions of the actual work 300.

As shown in FIG. 18A, the work 300 includes a glass substrate (carrier) 32, a polyimide layer 34 bound to the glass substrate 32, and a plurality of devices 36 formed on the polyimide layer 34. In this example, respective ones of the plurality of devices 36 have an identical structure. Each of the devices 36 has a structure which operates as a flexible electronic device, e.g., a flexible display, after the polyimide layer 34 is delaminated from the glass substrate 32. A typical example of the devices 36 is an electronic device which includes a thin film transistor layer, an OLED layer, an electrode layer and a wire layer. The thin film transistor can be made of amorphous silicon, polycrystalline silicon, any other type of inorganic semiconductor layer, or an organic semiconductor. Formation of the polycrystalline silicon can be realized by melting and recrystallizing a non-crystalline silicon layer deposited on the glass substrate 32 using a conventional ELA unit. Each of the devices 36 is encapsulated with a barrier film against moisture and gas.

FIG. 18B shows a state in the middle of irradiation of the work 300 with the line beam 30L. In this example, the irradiation with the line beam 30L causes formation of a gap 34a between the glass substrate 32 and the polyimide layer 34. The wavelength of the line beam 30L is selected such that large part of the line beam 30L is transmitted through the glass substrate 32 and absorbed by the polyimide layer 34. When a polyimide layer 34 which has a thickness of, for example, about 5-200 µm is irradiated with a line beam which has a wavelength of, for example, 250-450 nm (e.g., 100-300 millijoule/cm$^2$), the polyimide layer 34 can be delaminated from the glass substrate 32. Of presently-existing practical semiconductor laser devices, a semiconductor laser device of the shortest wavelength has an oscillation wavelength of about 350 nm. It is expected that, in the future, this wavelength will be further shortened and the optical output will be increased.

The spectral absorbance of polyimide and the spectral transmittance of glass depend on the type of polyimide and the type of glass, respectively. Thus, the material and thickness of these constituents and the wavelength and light intensity of the line beam 30L are determined such that the delamination efficiently advances.

FIG. 18C shows a state after completion of the irradiation of the work 300 with the line beam 30L. As illustrated in the drawing, the plurality of devices 36 which are supported by the polyimide layer 34 are lifted off and delaminated from the glass substrate 32. When the plurality of devices 36 are supported by a single continuous polyimide layer 34, the polyimide layer 34 is divided after the laser lift-off process, and the plurality of devices 36 are separated from one another. The thus-obtained devices 36 do not include a highly-rigid constituent, such as the glass substrate 32, and therefore have flexibility.

In the above-described example, in the work 300 used, the polyimide layer 34 is in contact with the glass substrate 32. However, application of the laser lift-off method of the present invention is not limited to such an example. Between the glass substrate 32 and the polyimide layer 34, a sacrificial layer may be provided which absorbs laser light for enhancing delamination. Alternatively, a layer which is made of a material other than polyimide may be used as a base of a flexible device. Still alternatively, a carrier which is made of a material other than glass may be used instead of the glass substrate 32.

In the above-described example, a flexible display is delaminated from a glass substrate. However, application of the laser lift-off method of the present invention is not limited to such an example. The laser lift-off method of the present invention can also be used for deamination of an LED from a crystal-growth substrate, such as sapphire substrate. According to an electronic device production method including such a laser lift-off process, a work which includes a carrier and various electronic devices bound to the carrier is provided and then irradiated with a line beam, whereby electronic devices delaminated from the carrier can be obtained.

Figure 19:
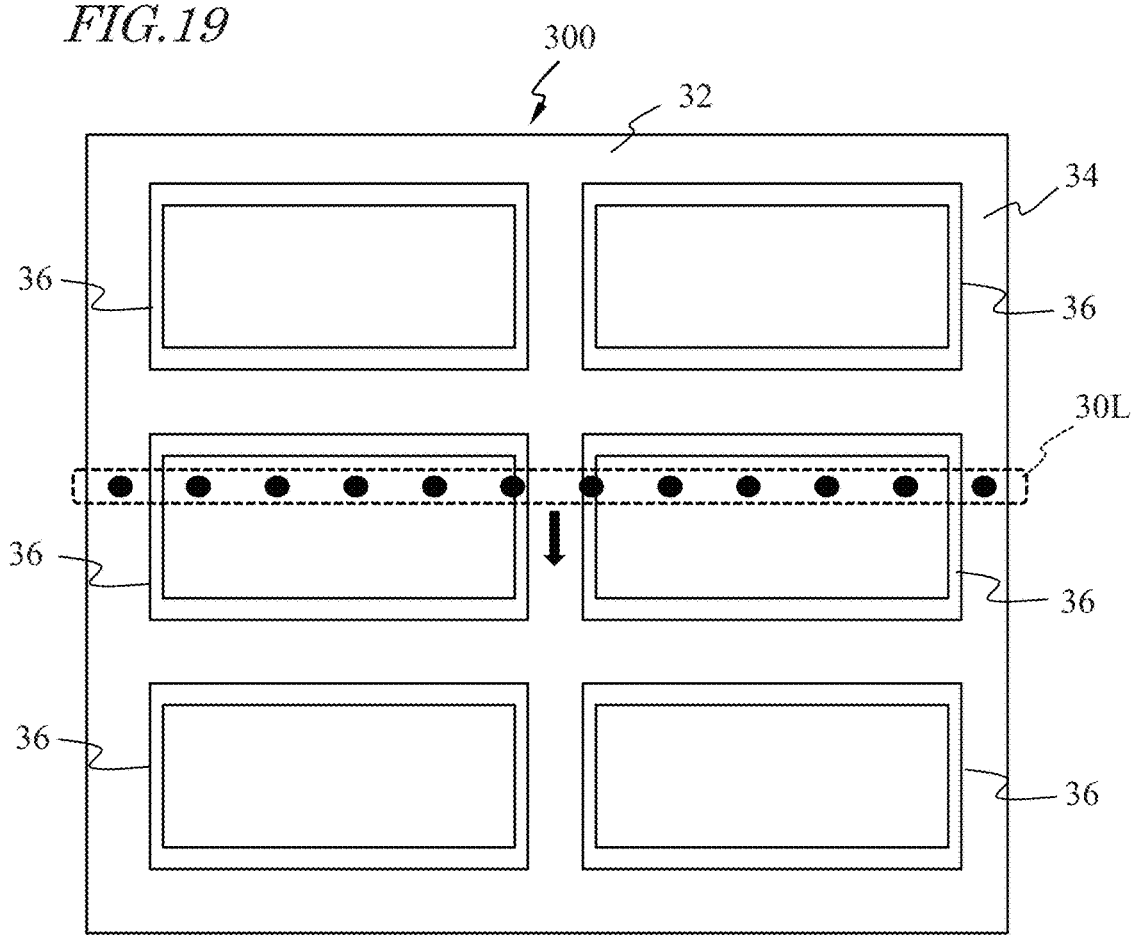
FIG. 19 is a plan view schematically showing a region on the work 300 irradiated with the line beam 30L.

FIG. 19 is a plan view schematically showing a region on the work 300 irradiated with the line beam 30L (a portion enclosed by a broken line). Black dots in the irradiated region represent the positions of the emission regions 24 of the semiconductor laser devices 40 of the line beam source 100 (not shown), which are projected onto the work 300. In this example, laser light emitted from 12 semiconductor laser devices 40 form the line beam 30L.

As shown in FIG. 19, the structure of the work 300 is not uniform according to the positions of projection of the emission regions 24 of the 12 semiconductor laser devices 40. That is, the work 300 includes a region in which the devices 36 are not present and a region in which the devices 36 are present. Between these regions, the heat capacity differs according to the presence/absence of the devices 36. Thus, when these regions are irradiated with laser light of the same light intensity, there is a probability that the degree of delamination will differ between these regions. The line beam irradiation apparatus 1000 is capable of irradiating a portion of the work 300 which has a large heat capacity with light of relatively-high light intensity and irradiating a portion of the work 300 which has a small heat capacity with light of relatively-low light intensity even if these portions are on the same line.

Figure 20:
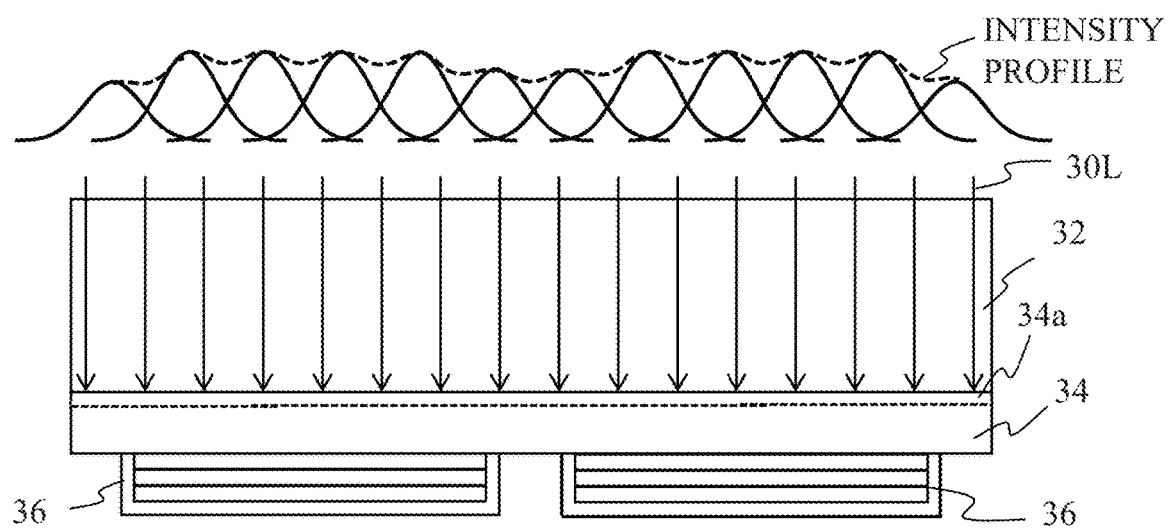
FIG. 20 is a schematic cross-sectional view showing an example where the light intensity distribution of the line beam 30L is spatially modulated according to the position of the work 300.

FIG. 20 is a schematic cross-sectional view showing an example where the light intensity distribution of the line beam 30L is spatially modulated according to the position of the work 300. Curves shown in the upper part of FIG. 20 represent the intensity distribution of laser light emitted from the 12 semiconductor laser devices 40. The broken line represents the light intensity distribution of the merged line beam 30L. In this example, the 12 semiconductor laser devices 40 emit laser light of different powers (light intensities) according to the position. The LD driving circuit 80 of FIG. 10 and FIG. 11 is capable of independently controlling the optical output of each of the semiconductor laser devices 40.

As previously described with reference to FIG. 15 to FIG. 17, according to the present embodiment, temporal light intensity modulation can be carried out. Further, spatial light intensity modulation can also be carried out as illustrated in FIG. 20. Changing the light intensity distribution of the line beam 30L according to the irradiation position on the work 300 can be realized by, generally, two methods described below.

The first method is to program in advance the light intensity of a plurality of semiconductor laser devices according to the structure of the work 300. The second method is to adjust or correct the light intensity of a plurality of semiconductor laser devices 40 in real time while monitoring the structure or state of the work 300 using an image sensor. The latter method may be combined into the former method. When the second method is carried out, for example, the structure or state of the work 300 is detected in real time using an image sensor, and an area which is to be irradiated is divided into a plurality of cells by image processing. The target value of the light intensity is set for each cell, and the light intensity of each semiconductor laser device is adjusted.

While scanning the work 300 with the line beam 30L, it is also possible to detect a region in which delamination is incomplete (delamination failure region) using, for example, an image sensor. When such a delamination failure region is detected, the positional coordinates of that region are stored in the memory 74. Then, the second scanning of that work 300 can be carried out. The second scanning only requires irradiating only the delamination failure region with laser light. In an extreme example, the second scanning can be completed only by applying laser light from a single semiconductor laser device 40 onto a single delamination failure region.

The line beam irradiation apparatus 1000 may include two line beam sources 100. When a delamination failure region caused during the irradiation by the preceding first line beam source 100 is detected by an image sensor, one of the semiconductor laser devices 40 of the succeeding second line beam source 100 corresponding to the detected delamination failure region is selectively caused to emit light. By thus carrying out complemental irradiation with laser light, repair of a defect can be realized in the same step.

Figure 21A:
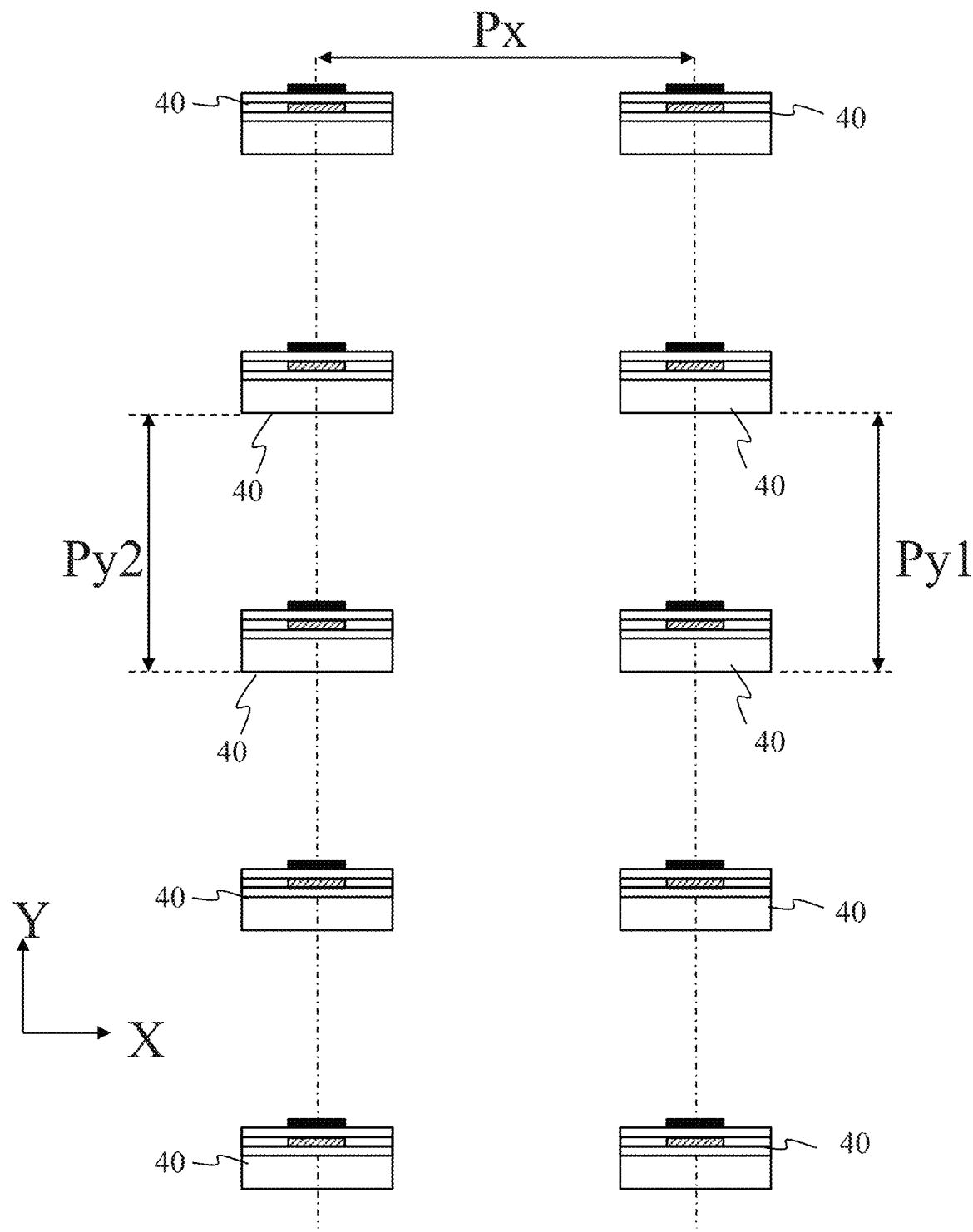
FIG. 21A shows two columns of semiconductor laser devices 40 which are separated by the distance between the centers, Px.
Figure 21B:
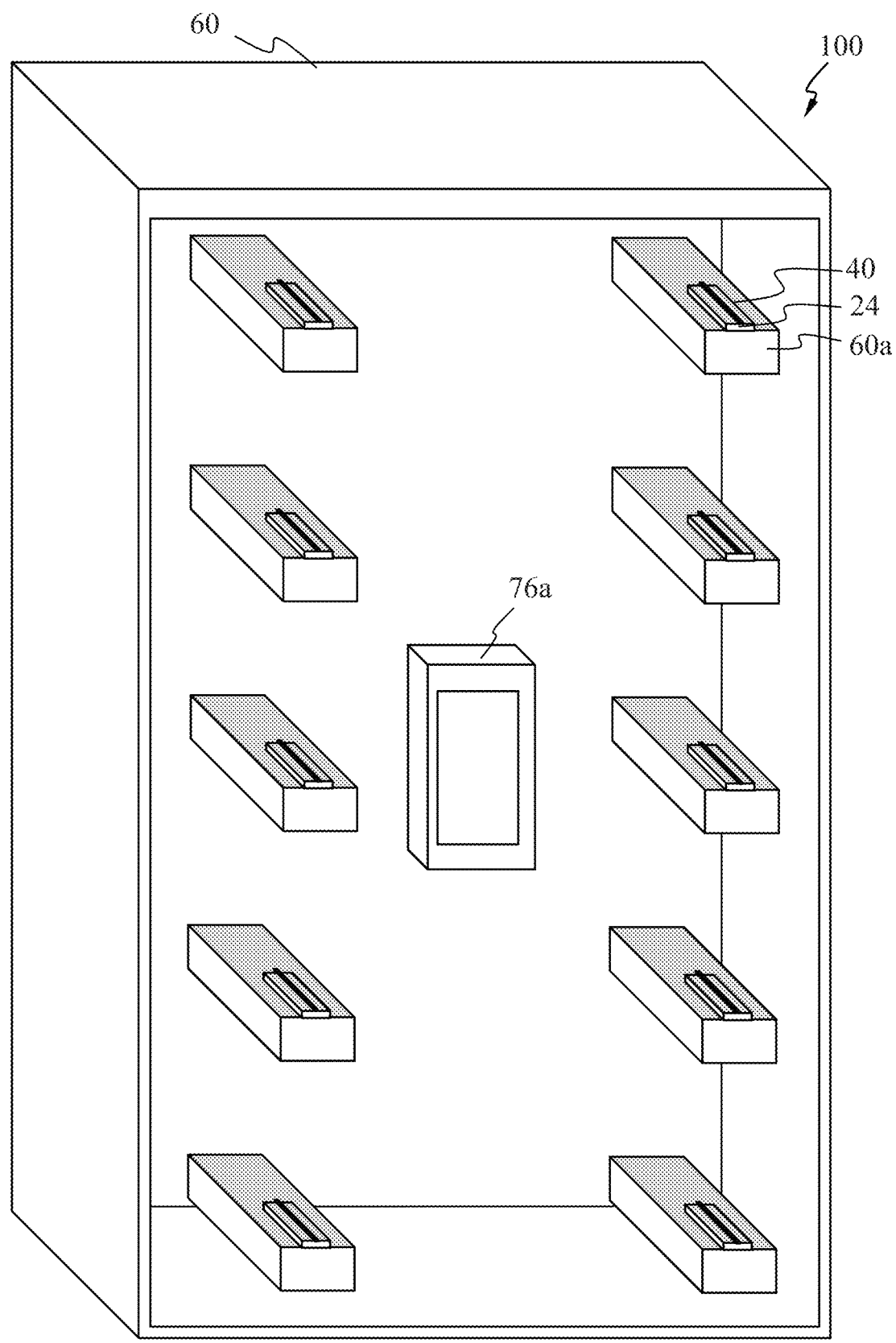
FIG. 21B is a perspective view showing a configuration example of the line beam source 100 which realizes the arrangement of FIG. 21A.
Figure 21C:
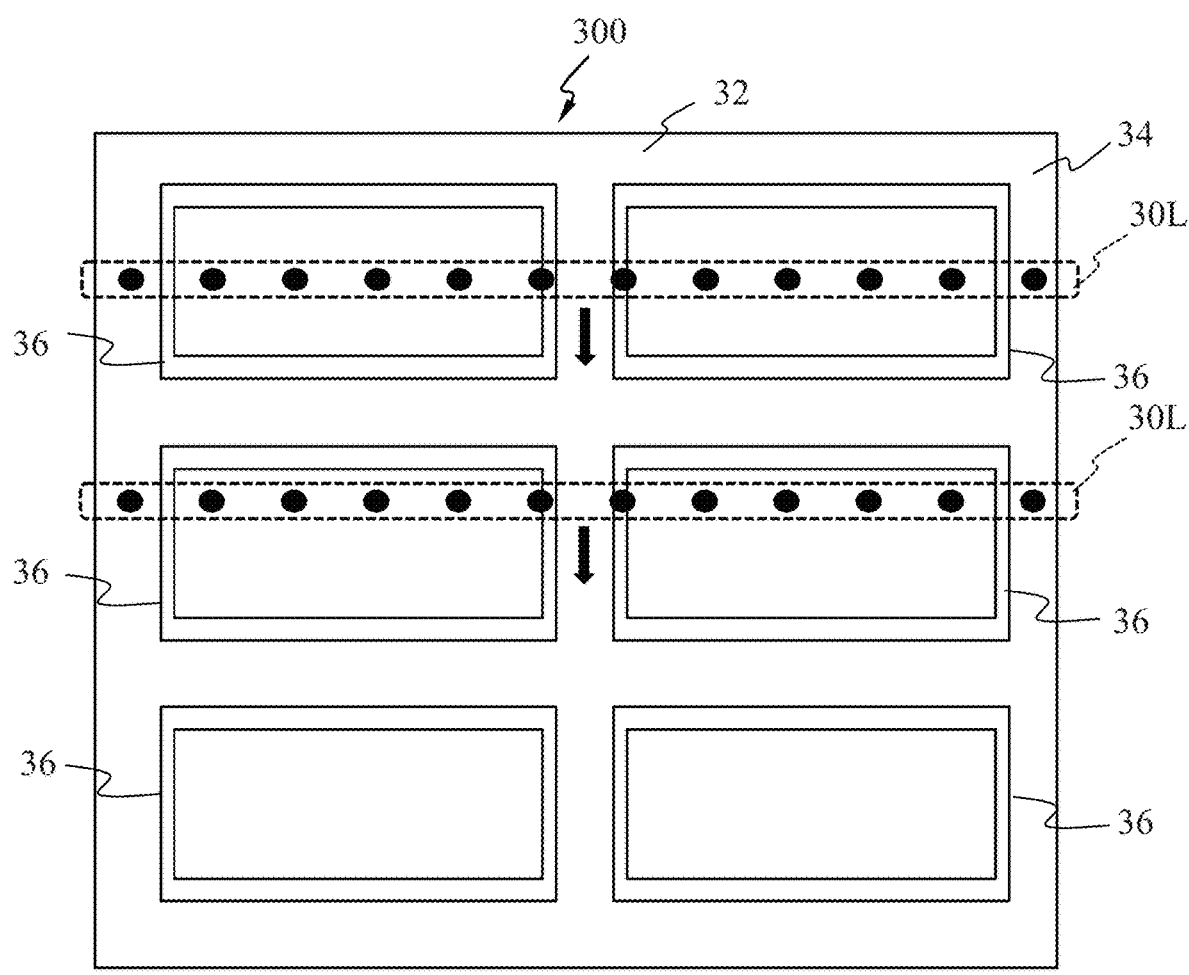
FIG. 21C schematically shows the positions of the emission regions 24 in the two columns of semiconductor laser devices 40, which are projected onto the work 300.

Alternatively, a single line beam source may include two columns of semiconductor laser devices 40. FIG. 21A shows two columns of semiconductor laser devices 40 which are separated by the distance between the centers, Px. Px can be set in the range of, for example, not less than 10 mm and not more than 200 mm. The first column which is to irradiate earlier includes a plurality of semiconductor laser devices 40 arranged at the pitch of Py1 in the Y-axis direction. The succeeding column includes a plurality of semiconductor laser devices 40 arranged at the pitch of Py2 in the Y-axis direction. In the illustrated example, Py1=Py2, although the present invention is not limited to this example. FIG. 21B is a perspective view showing a configuration example of the line beam source 100 which includes such semiconductor laser devices 40. FIG. 21C schematically shows the positions of the emission regions 24 in the two columns of semiconductor laser devices 40, which are projected onto the work 300. In the example of FIG. 21C, the work 300 is irradiated with the line beam 30L which is formed by a line beam source in which each column includes 12 semiconductor laser devices 40.

Figure 21D:
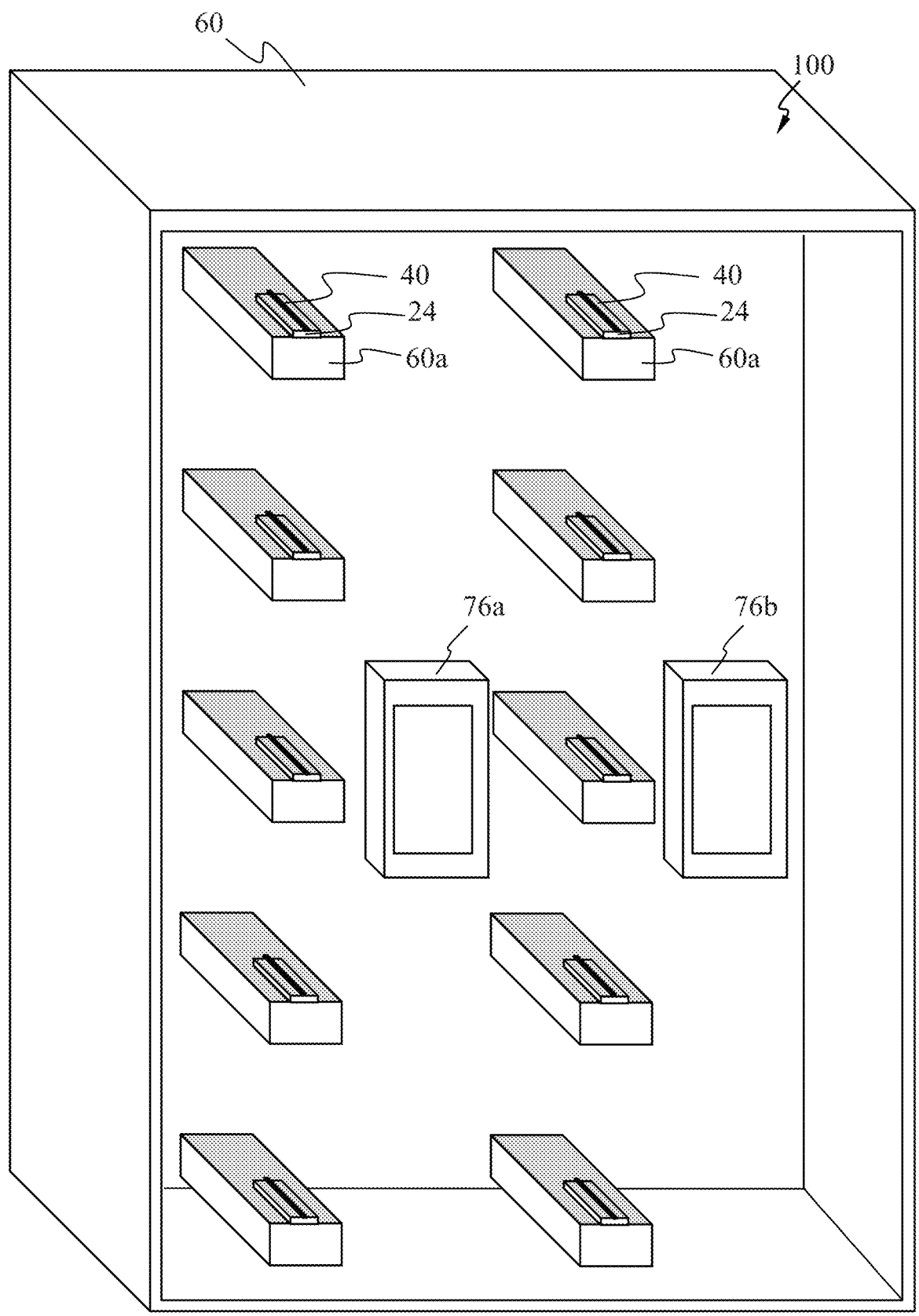
FIG. 21D is a perspective view showing another configuration example of the line beam source 100 which realizes the arrangement of FIG. 21A.
Figure 21E:
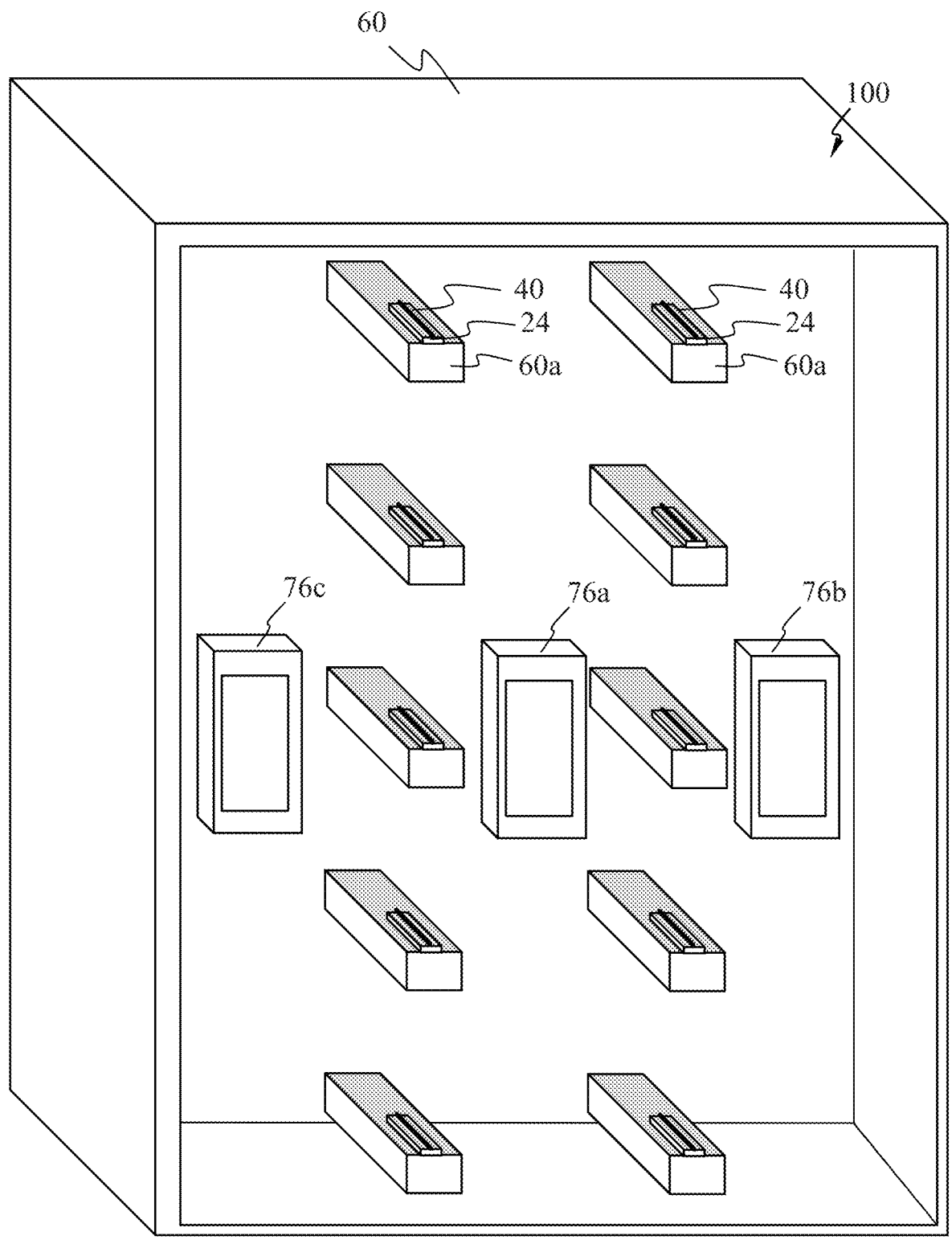
FIG. 21E is a perspective view showing a configuration example of the line beam source 100 which realizes a variation of the arrangement of FIG. 21A.

According to such an example, a region in which delamination by irradiation with line beam 30L formed by a plurality of semiconductor laser devices 40 included in the preceding first column is not completed during scanning is adequately repaired by lighting up one or more of a plurality of semiconductor laser devices 40 included in the succeeding column. The semiconductor laser devices 40 of the second column are arranged on the second same line and serve as auxiliary semiconductor laser devices. As shown in FIG. 21B, an image sensor 76a may be provided between the first column and the second column of the semiconductor laser devices 40 of the line beam source 100 for monitoring the state of delamination. Furthermore, as shown in FIG. 21D, another image sensor 76b may be provided behind the second column of the semiconductor laser devices 40 as viewed in the scanning direction for monitoring the state of delamination. When the moving direction of the line beam source 100 is reversed such that the line beam source 100 reciprocates, a still another image sensor 76c may be further provided ahead of the first column of the semiconductor laser devices 40 as shown in FIG. 21E. When the configuration of FIG. 21E is employed, either one of the image sensors 76b, 76c is always on the rear side as viewed in the scanning direction even if the scanning direction is reversed, so that the state of delamination can be monitored.

The two columns of the semiconductor laser devices 40 may be close to each other by a distance of not more than 10 mm. The process may be configured such that the semiconductor laser devices 40 of the preceding first column "preheat" a work, and the semiconductor laser devices 40 of the succeeding second column achieve "delamination". Various line beam irradiation processes can be performed on the work 300 by allowing the semiconductor laser devices 40 of the first column and the semiconductor laser devices 40 of the second column to produce line beams of different light intensities. The number of columns is not limited to two. The laser light emitted from the respective columns of the semiconductor laser devices 40 have different wavelengths. The process may be configured such that the preceding column emits a line beam of a relatively-long wavelength, and then the succeeding column emits a line beam of a relatively-short wavelength. Conversely, the process may be configured such that the preceding column emits a line beam of a relatively-short wavelength, and then the succeeding column emits a line beam of a relatively-long wavelength.

Figure 22A:
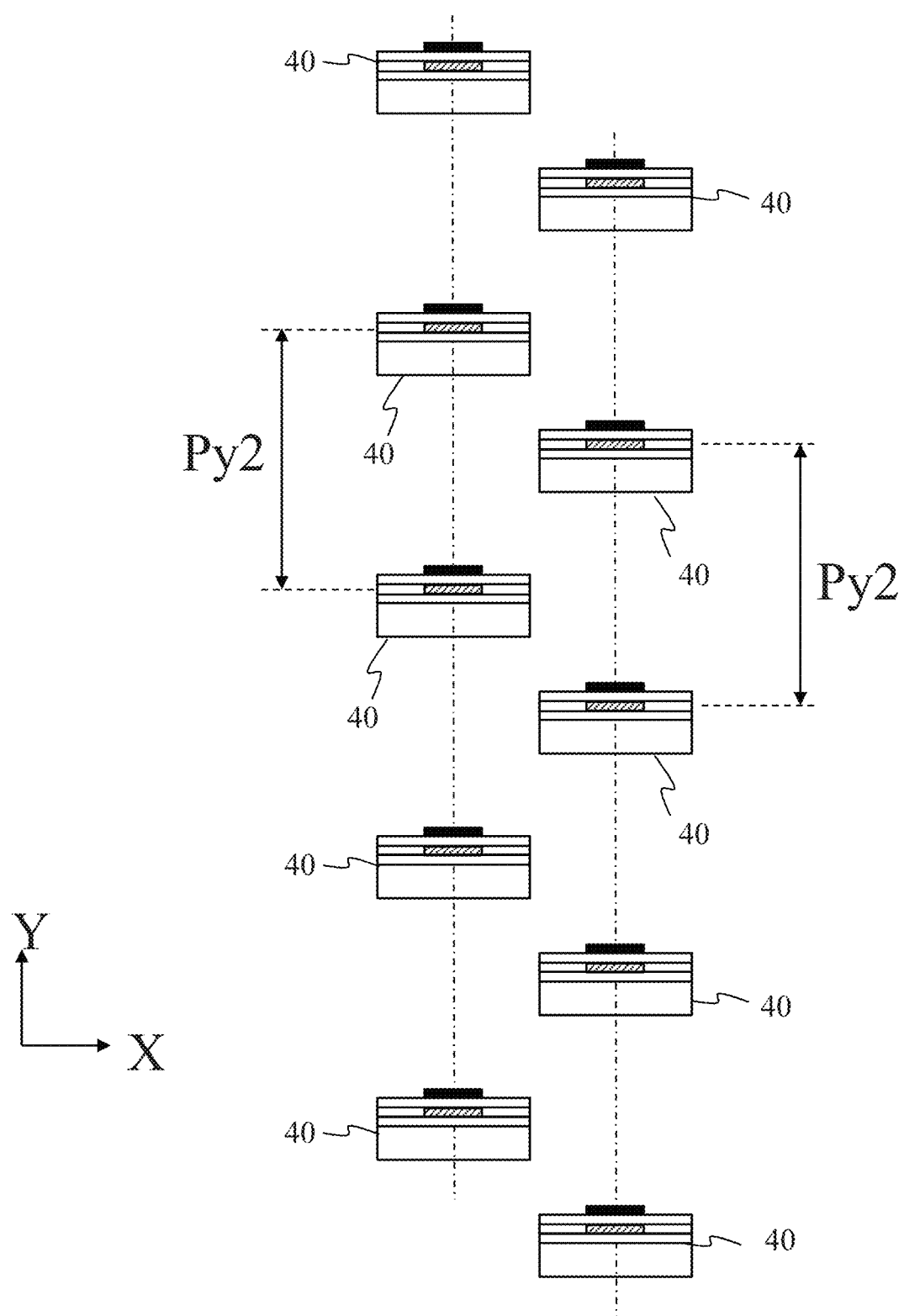
FIG. 22A is a plan view showing semiconductor laser devices 40 in a staggered arrangement.
Figure 22B:
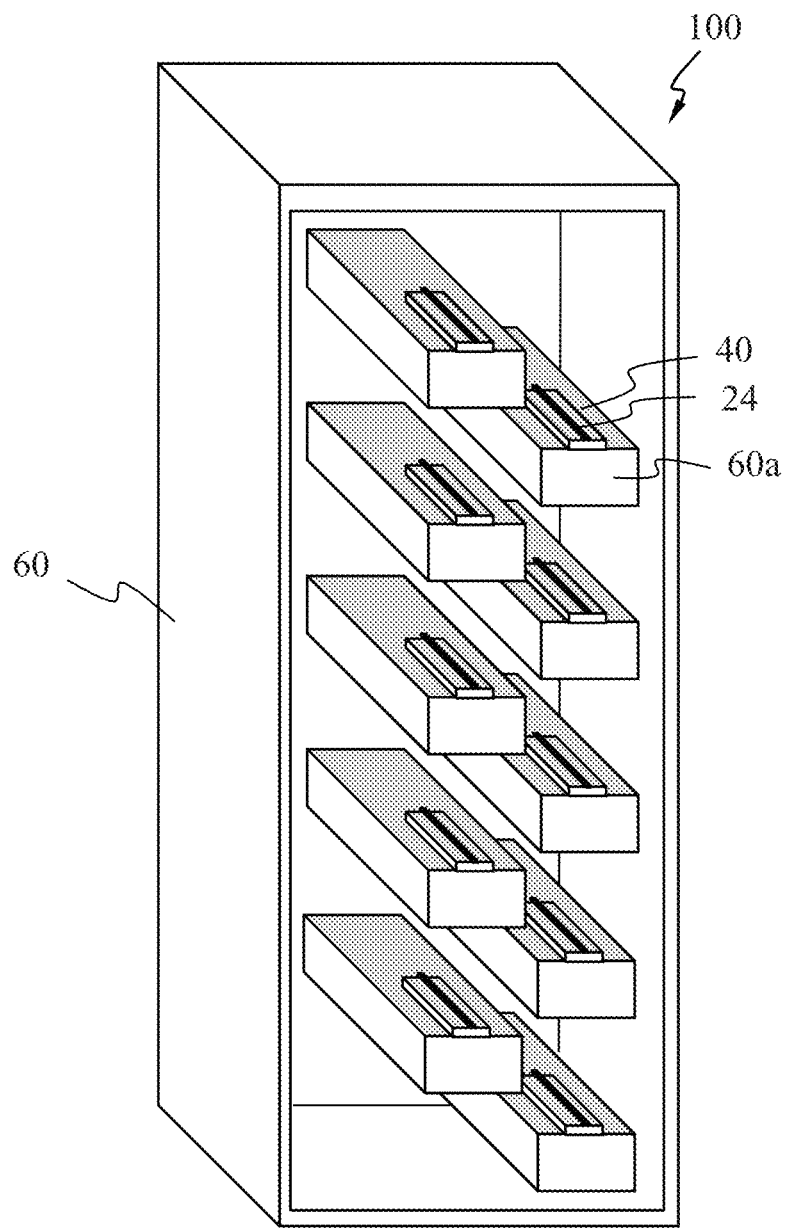
FIG. 22B is a perspective view showing a configuration example of the line beam source 100 which realizes the staggered arrangement of FIG. 22A.

FIG. 22A is a diagram showing another arrangement example of the semiconductor laser devices 40 in the line beam source 100. FIG. 22B is a perspective view showing a configuration example of the line beam source 100 which includes the thus-arranged semiconductor laser devices 40. FIG. 22C schematically shows the positions of the emission regions 24 of the semiconductor laser devices 40 arranged in two columns, which are projected onto the work 300. In this example, the semiconductor laser devices 40 arranged in two columns have a stagger pattern (staggered arrangement). By reducing the distance between the centers of the two columns, a single line beam can be formed in total. When the orientation of the semiconductor laser devices 40 is adjusted such that the optical axes of the semiconductor laser devices 40 included in the first column and the optical axes of the semiconductor laser devices 40 included in the second column intersect with each other on the work 300, substantially a single line beam can be formed. The light intensity of the thus-formed line beam is more uniform in the fast axis direction.

Figure 23:
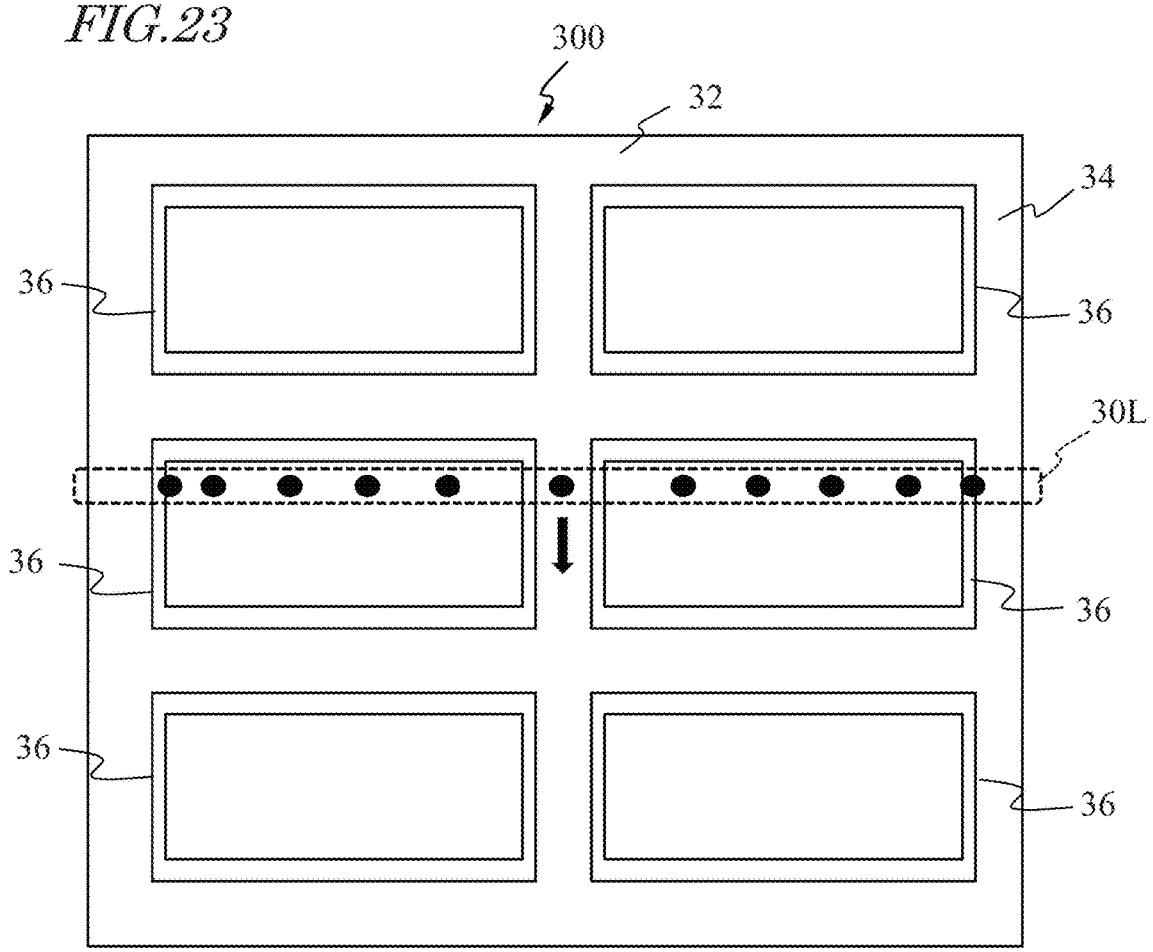
FIG. 23 is a plan view schematically showing the positions of the emission regions 24 of semiconductor laser devices 40, which are projected onto the work 300, where the distance between the centers of adjoining semiconductor laser devices 40 varies according to the position.
Figure 24:
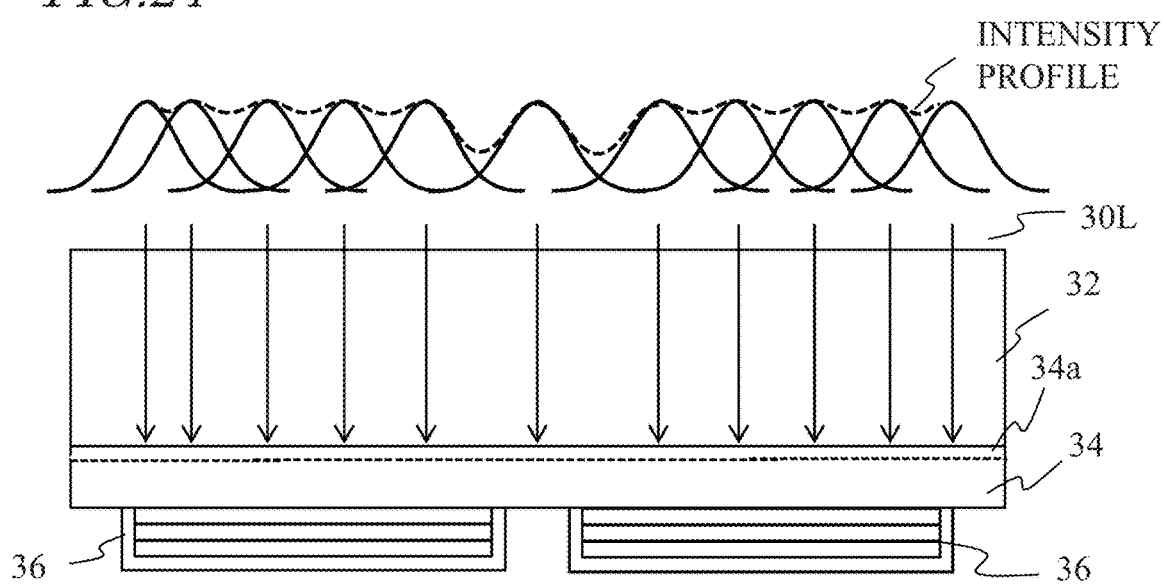
FIG. 24 is a diagram schematically showing the light intensity distribution of a line beam 30L formed by semiconductor laser devices 40 where the distance between the centers of adjoining semiconductor laser devices 40 varies according to the position.
Figure 25:
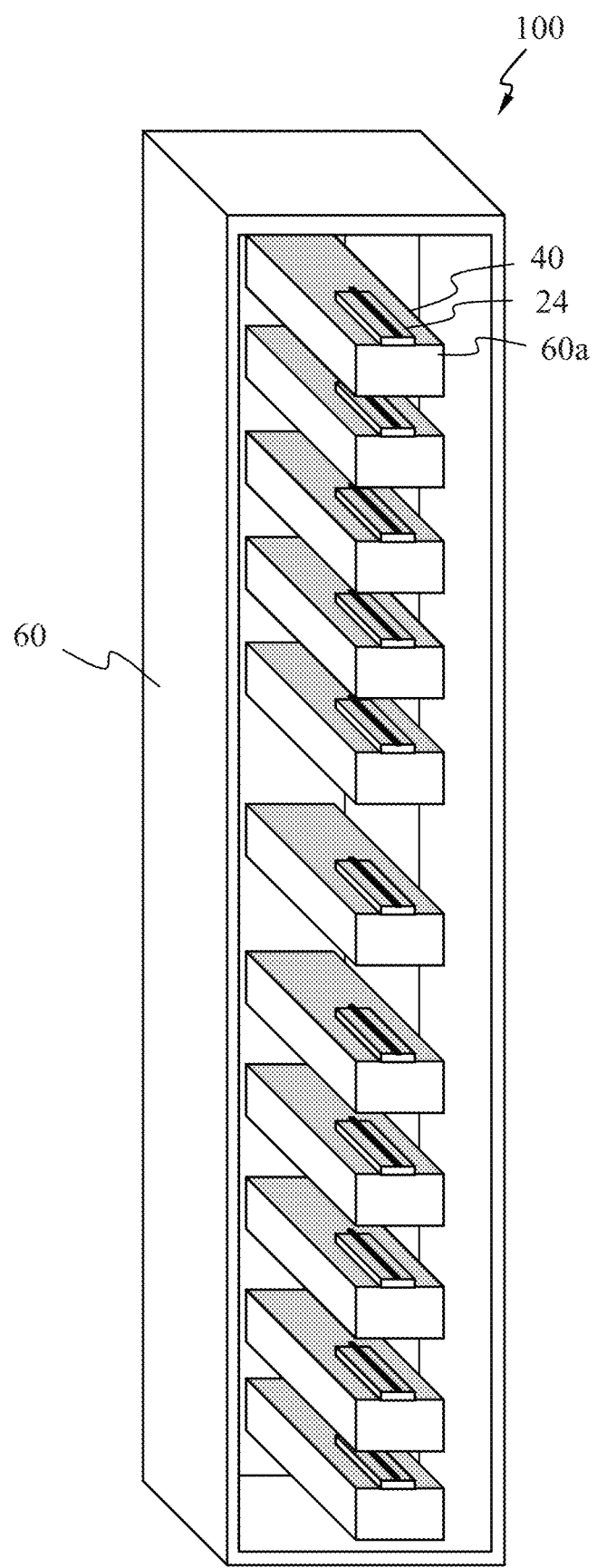
FIG. 25 is a perspective view showing a configuration example where the distance between the centers of adjoining semiconductor laser devices varies according to the position.

FIG. 23 is a plan view schematically showing the positions of the emission regions 24 of semiconductor laser devices 40, which are projected onto the work 300, where the distance between the centers of adjoining semiconductor laser devices 40 varies according to the position. FIG. 24 is a diagram schematically showing the light intensity distribution of the line beam 30L formed by the thus-arranged semiconductor laser devices 40. FIG. 25 is a perspective view showing a configuration example of the line beam source 100 which realizes the light intensity distribution shown in FIG. 24. When the structure of the work 300 is already known, the arrangement of the semiconductor laser devices 40 can be adjusted in advance to the structure of the work 300. In a use where a lift-off process is performed on a large quantity of works 300 which have the same structure, the arrangement of the semiconductor laser devices 40 may be determined according to the works 300.

As described in the foregoing, the embodiments of the line beam source and the line beam irradiation apparatus of the present invention can have various configurations according to the use or the structure of a work.

In the above-described embodiments of the line beam source and the line beam irradiation apparatus of the present invention, a complicated optical system for making the light intensity or fluence of a line beam constant along the longitudinal direction of the line beam is unnecessary. Further, the price of the semiconductor laser devices is extremely low as compared with the price of excimer laser devices. Therefore, according to the embodiments of the present invention, the cost of the line beam irradiation apparatus and the laser lift-off method is decreased, and a path for application of line beam irradiation to various uses is made. The oscillation state of the semiconductor laser devices can be easily turned on and off whereas the excimer laser devices need to continue laser oscillation during the operation of the apparatus. Thus, according to the embodiments of the present invention, laser oscillation can be selectively carried out only in part of the period of scanning of an irradiated region in which light irradiation necessary for delamination is executed, so that the life of the light source can be extended, and the running cost such as electricity cost can be saved. Further, the line beam irradiation apparatus of the present invention is capable of emitting continuous wave laser light, rather than pulsed wave laser light, and is therefore capable of emitting laser light of relatively-low intensity for a relatively-long time as compared with laser light irradiation by a conventional ELA unit and YAG laser device. As a result, even if the uniformity in irradiation density is low, the heat distribution in the work can be easily evened out. The line beam irradiation apparatus of the present invention can also be used instead of a conventional expensive ELA unit and YAG laser device for melting and recrystallization of a semiconductor layer. The variations of the line beam source 100 which have previously been described with reference to FIG. 21A to FIG. 25 are also applicable to uses other than the laser lift-off method.

In the attached drawings, for simplicity, the semiconductor laser devices shown are in the form of bare chips. As previously described, the semiconductor laser devices mounted to a package or cartridge may be placed on the supports 60a. In that case, the supports have a connector for holding the package or cartridge. Such a connector can have an arbitrary structure so long as it has a mechanism for detachably holding each package or cartridge.

Each of the semiconductor laser devices illustrated in the present disclosure is a semiconductor laser device of a single-emitter structure which has a single emission region, although the present invention is not limited to this example. If each of the semiconductor laser devices includes two or more emission regions and the emission regions form one or a plurality of line beams, a semiconductor laser device of a multi-emitter structure may be used.

As seen from FIG. 7B, even if the position of each of the semiconductor laser devices 40 is slightly shifted in the slow axis direction, a line beam 30L which can be practically used without difficulty is formed. The tolerance for misalignment in the slow axis direction of the semiconductor laser devices 40 can be determined such that a continuous line beam 30L is formed on the irradiated surface. The misalignment in the slow axis direction of the semiconductor laser devices 40 is set to, for example, an amount not more than the size in the slow axis direction of the emission region 24, Ex.

INDUSTRIAL APPLICABILITY

A line beam source and a line beam irradiation apparatus of the present invention can be used for the method of producing an electronic device, such as LED, flexible display, or the like. Particularly, a line beam source and a line beam irradiation apparatus of the present invention can be suitably used for laser lift-off, although they can also be used for processing of an object, reforming, melting, crystallization, recrystallization, cutting, activation of impurities in semiconductor, and sterilization. A line beam source of the present invention can be used as a light source for efficiently lighting a plurality of plants arranged along the same line in a plant factory with light of a wavelength suitable for photosynthesis.

REFERENCE SIGNS LIST 10 semiconductor laser device
12 p-side electrode
16 n-side electrode
20 substrate
22 semiconductor multilayer stack
22a p-side cladding layer
22b active layer
22c n-side cladding layer
24 emission region
26a facet (front side) of semiconductor multilayer stack
26b upper surface of semiconductor multilayer stack
26C facet (rear side) of semiconductor multilayer stack
30 laser light
30C collimated laser light
30L line beam
32 glass substrate
34 polyimide layer
34a gap
36 device
40 semiconductor laser device (laser diode)
45 irradiated surface
50F fast axis collimator lens
50S cylindrical lens
60 casing
60a support
70 controller
74 memory
76 sensor
76a image sensor
76b image sensor
76c image sensor
80 LD driving circuit
90 transporting device driving circuit
100 line beam source
200 work stage
250 transporting device
300 work
400 laser diode array
410 laser bar
1000 line beam irradiation apparatus

The invention claimed is:

1. A line beam irradiation apparatus comprising:
a work stage;
a line beam source for irradiating a work placed on the work stage with a line beam; and
a transporting device for moving at least one of the work stage and the line beam source such that an irradiation position of the line beam on the work moves in a direction transverse to the line beam,
wherein the line beam source includes a plurality of semiconductor laser devices and a support for supporting the plurality of semiconductor laser devices,
each of the plurality of semiconductor laser devices includes a semiconductor multilayer stack which has a facet, the facet including an emission region from which laser light is to be emitted, the emission region having a size in a fast axis direction that is parallel to a layer stacking direction of the semiconductor multilayer stack and a size in a slow axis direction that is perpendicular to the layer stacking direction, and
the plurality of semiconductor laser devices is arranged along a same line extending in the fast axis direction, the laser light emitted from the emission regions of respective ones of the plurality of semiconductor laser devices diverge parallel to the same line to form the line beam, and the laser light emitted from the emission region of each of the plurality of semiconductor laser devices are not collimated in the fast axis direction,
wherein the line beam source further comprises an actuator for oscillating or moving the plurality of semiconductor laser devices in the fast axis direction to even out a light intensity distribution along the fast axis direction of the line beam.

2. A line beam source comprising:
a plurality of semiconductor laser devices; and
a support for supporting the plurality of semiconductor laser devices,
wherein each of the plurality of semiconductor laser devices includes a semiconductor multilayer stack which has a facet, the facet including an emission region from which laser light is to be emitted, the emission region having a size in a fast axis direction that is parallel to a layer stacking direction of the semiconductor multilayer stack and a size in a slow axis direction that is perpendicular to the layer stacking direction, and
the plurality of semiconductor laser devices is arranged along a same line extending in the fast axis direction, the laser light emitted from the emission regions of respective ones of the plurality of semiconductor laser devices diverge parallel to the same line to form a line beam, and the laser light emitted from the emission region of each of the plurality of semiconductor laser devices are not collimated in the fast axis direction, wherein the line beam source further comprises an actuator for oscillating or moving the plurality of semiconductor laser devices in the fast axis direction to even out a light intensity distribution along the fast axis direction of the line beam.

* * * * *

UNITED STATES PATENT AND TRADEMARK OFFICE
CERTIFICATE OF CORRECTION

PATENT NO. : 11,224,937 B2
APPLICATION NO. : 16/065858
DATED : January 18, 2022
INVENTOR(S) : Katsuhiko Kishimoto It is certified that error appears in the above-identified patent and that said Letters Patent is hereby corrected as shown below:

On the Title Page

Item (54) and in the Specification, Column 1, Lines 1-3 should read:
(54) LINE BEAM SOURCE, LINE BEAM IRRADIATION APPARATUS, AND LASER LIFT-OFF METHOD Signed and Sealed this
Twenty-third Day of January, 2024

Katherine Kelly Vidal
*Director of the United States Patent and Trademark Office*